United States Patent
Jung et al.

(10) Patent No.: US 12,154,988 B2
(45) Date of Patent: Nov. 26, 2024

(54) MULTI-OXIDE-SEMICONDUCTOR FIELD-EFFECT TRANSISTOR WITH STACKED SOURCE/DRAIN STRUCTURE

(71) Applicant: Samsung Electronics Co., Ltd., Suwon-si (KR)

(72) Inventors: Sujin Jung, Hwaseong-si (KR); Jinbum Kim, Seoul (KR); Dahye Kim, Seoul (KR); Ingyu Jang, Seoul (KR); Dongsuk Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 438 days.

(21) Appl. No.: 17/585,686

(22) Filed: Jan. 27, 2022

(65) Prior Publication Data
US 2022/0416082 A1    Dec. 29, 2022

(30) Foreign Application Priority Data
Jun. 24, 2021   (KR) .......................... 10-2021-0081981

(51) Int. Cl.
| | |
|---|---|
| H01L 29/78 | (2006.01) |
| H01L 29/08 | (2006.01) |
| H01L 29/10 | (2006.01) |

(52) U.S. Cl.
CPC ...... *H01L 29/7848* (2013.01); *H01L 29/0847* (2013.01); *H01L 29/1033* (2013.01)

(58) Field of Classification Search
CPC ......... H01L 29/42392; H01L 29/78696; H01L 29/7848; H01L 29/0847; H01L 29/1033; H01L 29/1079; H01L 29/0673; H01L 29/1054
See application file for complete search history.

(56) References Cited

U.S. PATENT DOCUMENTS

| | | | |
|---|---|---|---|
| 9,543,418 B2 | 1/2017 | Ching et al. | |
| 2019/0067490 A1* | 2/2019 | Yang | ................. H01L 29/66439 |
| 2019/0081155 A1 | 3/2019 | Xie et al. | |
| 2020/0381547 A1 | 12/2020 | Song et al. | |
| 2020/0381564 A1 | 12/2020 | Kang et al. | |
| 2020/0395482 A1 | 12/2020 | Song et al. | |
| 2021/0036122 A1 | 2/2021 | Wong et al. | |
| 2021/0098302 A1 | 4/2021 | Ju et al. | |
| 2022/0157969 A1* | 5/2022 | Yin | ................... H01L 29/66553 |
| 2022/0367622 A1* | 11/2022 | Lin | ................... H01L 29/78696 |

* cited by examiner

*Primary Examiner* — Changhyun Yi
(74) *Attorney, Agent, or Firm* — Muir Patent Law, PLLC

(57) ABSTRACT

Disclosed are a semiconductor device and a method of fabricating the same, the semiconductor device including an active pattern on a substrate, a source/drain pattern on the active pattern, a channel pattern on the active pattern, connected to the source/drain pattern, and including stacked semiconductor patterns, a gate electrode extending in a first direction and crossing the channel pattern, and a gate insulating layer between the gate electrode and the channel pattern. The source/drain pattern includes first and second semiconductor layers, the first semiconductor layer including a center portion including a second outer side surface in contact with the gate insulating layer and an edge portion adjacent to a side of the center portion and including a first outer side surface in contact with the gate insulating layer. The second outer side surface is further recessed toward the second semiconductor layer, compared with the first outer side surface.

20 Claims, 40 Drawing Sheets

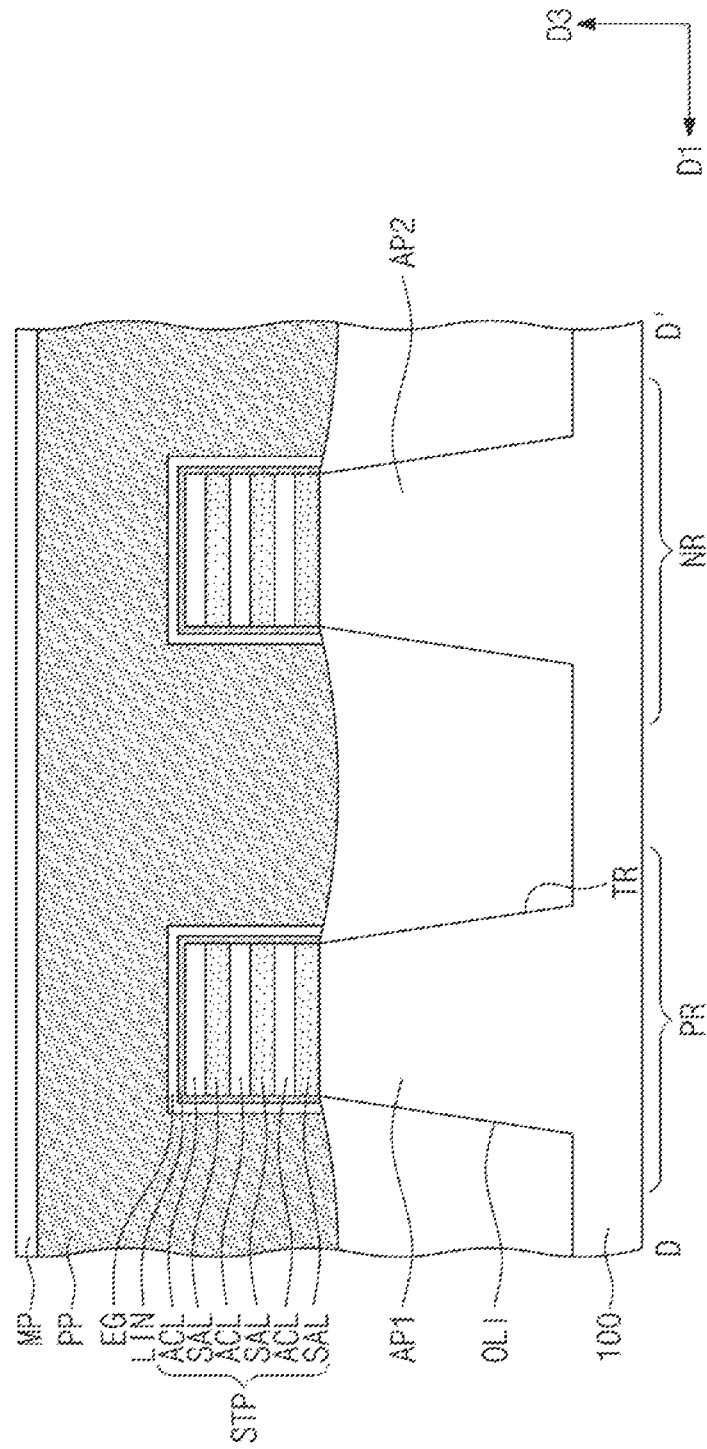

MULTI-OXIDE-SEMICONDUCTOR FIELD-EFFECT TRANSISTOR WITH STACKED SOURCE/DRAIN STRUCTURE

CROSS-REFERENCE TO RELATED APPLICATIONS

This U.S. non-provisional patent application claims priority under 35 U.S.C. § 119 to Korean Patent Application No. 10-2021-0081981, filed on Jun. 24, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

An embodiment of the inventive concept provides a semiconductor device with improved reliability and electrical characteristics.

An embodiment of the inventive concept provides a method of fabricating a semiconductor device with improved reliability and electrical characteristics.

According to an embodiment of the inventive concept, a semiconductor device may include an active pattern on a substrate, a source/drain pattern on the active pattern, a channel pattern provided on the active pattern and connected to the source/drain pattern, the channel pattern including semiconductor patterns, which are stacked to be spaced apart from each other, a gate electrode extending in a first direction and crossing the channel pattern, and a gate insulating layer interposed between the gate electrode and the channel pattern. The source/drain pattern may include a first semiconductor layer and a second semiconductor layer on the first semiconductor layer, and the first semiconductor layer may include a center portion and an edge portion, which is adjacent to a side of the center portion in the first direction. The edge portion may include a first outer side surface in contact with the gate insulating layer, and the center portion may include a second outer side surface in contact with the gate insulating layer. The second outer side surface may be further recessed toward the second semiconductor layer, compared with the first outer side surface.

According to an embodiment of the inventive concept, a semiconductor device may include a substrate including a peripheral region, a peripheral active pattern on the peripheral region, a peripheral source/drain pattern on the peripheral active pattern, a peripheral channel pattern on the peripheral active pattern, the peripheral channel pattern including sacrificial layers and semiconductor patterns, which are alternately stacked, the semiconductor patterns including silicon (Si), the sacrificial layers including silicon-germanium (SiGe), a peripheral gate electrode on the peripheral channel pattern, and a liner layer interposed between the peripheral gate electrode and the peripheral channel pattern. The liner layer may have a thickness ranging from 1 nm to 5 nm, and the liner layer may include silicon-germanium (SiGe) or germanium (Ge). A germanium concentration of the liner layer may be higher than a germanium concentration of the sacrificial layers, and a difference between the germanium concentration of the liner layer and the germanium concentration of the sacrificial layers may be greater than 5 at %.

According to an embodiment of the inventive concept, a semiconductor device may include an active pattern on a substrate, a source/drain pattern on the active pattern, a channel pattern provided on the active pattern and connected to the source/drain pattern, the channel pattern including a first semiconductor pattern, a second semiconductor pattern, and a third semiconductor pattern, which are sequentially stacked to be spaced apart from each other, a gate electrode extending in a first direction and crossing the channel pattern, the gate electrode including a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern, a gate insulating layer interposed between the channel pattern and the gate electrode, a gate spacer on a side surface of the gate electrode, a gate capping pattern on a top surface of the gate electrode, a first interlayer insulating layer on the gate capping pattern, an active contact provided to penetrate the first interlayer insulating layer and coupled to the source/drain pattern, a gate contact provided to penetrate the first interlayer insulating layer and coupled to the gate electrode, a second interlayer insulating layer on the first interlayer insulating layer, a first metal layer provided in the second interlayer insulating layer, the first metal layer including first interconnection lines, which are electrically connected to the active and gate contacts, respectively, a third interlayer insulating layer on the second interlayer insulating layer, and a second metal layer provided in the third interlayer insulating layer. The second metal layer may include second interconnection lines, which are electrically connected to the first interconnection lines, respectively, and the first semiconductor pattern may include a first side surface and a second side surface, which are opposite to each other in the first direction. The first and second side surfaces may be covered with the gate insulating layer. A germanium concentration of the first semiconductor pattern may decrease from the first side surface toward a center region of the first semiconductor pattern, may have a minimum value at the center region, and may increase from the center region toward the second side surface.

According to an embodiment of the inventive concept, a method of fabricating a semiconductor device may include alternately stacking sacrificial layers and active layers on a substrate, patterning the sacrificial layers and the active layers to form a stacking pattern on an active pattern, forming a liner layer on the stacking pattern, forming a sacrificial pattern on the liner layer, etching the stacking pattern at a side of the sacrificial pattern to form a recess, an etch rate of the liner layer being higher than an etch rate of the sacrificial layers during the etching process to form the recess, forming a source/drain pattern, which includes a first semiconductor layer and a second semiconductor layer on the first semiconductor layer, in the recess, removing the sacrificial pattern and the liner layer to form an outer region, removing the sacrificial layers, which are exposed through the outer region, to form inner regions, and forming a gate electrode to fill the outer region and the inner regions.

BRIEF DESCRIPTION OF THE DRAWINGS

Example embodiments will be more clearly understood from the following brief description taken in conjunction with the accompanying drawings, in which like numerals refer to like elements throughout. The accompanying drawings represent non-limiting, example embodiments as described herein.

FIGS. 5A-5B, 6A-6B, 7A, 7B, 7C-7D, 8A, 8B, 8C-8D, 9A, 9B, 9C-9D, 10A, 10B, 10C, and -10D are sectional views illustrating a method of fabricating a semiconductor device, according to an example embodiment of the inventive concept.

DETAILED DESCRIPTION

Figure 1:
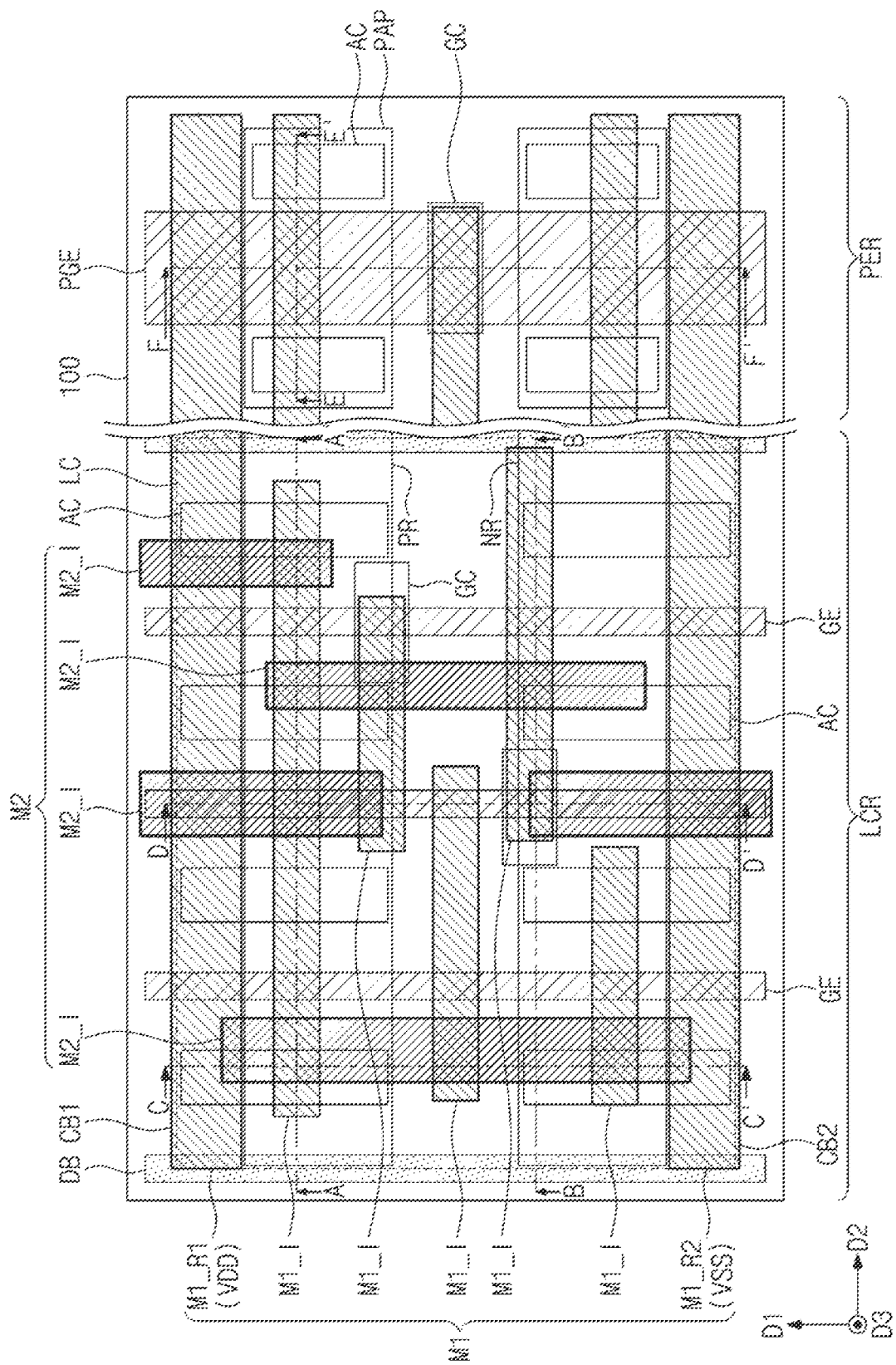
FIG. 1 is a plan view illustrating a semiconductor device, according to an example embodiment of the inventive concept.

FIG. 1 is a plan view illustrating a semiconductor device, according to an example embodiment of the inventive concept. FIGS. 2A to 2F are sectional views, which are respectively taken along lines A-A', B-B', C-C', D-D', E-E', and F-F' of FIG. 1. FIG. 3A is a top plan view taken along a line M-M' of FIG. 2A. FIG. 3B is a top plan view taken along a line N-N' of FIG. 2A.

Referring to FIG. 1, a substrate 100 including a logic cell region LCR and a peripheral region PER may be provided. The substrate 100 may be a semiconductor substrate that is formed of or includes silicon, germanium, silicon-germanium, a compound semiconductor material, or the like. In an embodiment, the substrate 100 may be a silicon wafer.

The logic cell region LCR may be a region on which a standard cell (i.e., a logic cell) constituting a logic circuit is disposed. At least one logic cell LC may be provided on the logic cell region LCR.

The peripheral region PER may be a region in which transistors constituting a processor core or input/output (I/O) terminals are disposed. The transistor in the peripheral region PER may be operated under high power condition, compared with the transistor in the logic cell region LCR.

Hereinafter, a logic cell LC on the logic cell region LCR will be described in more detail with reference to FIGS. 1 and 2A to 2D.

The logic cell LC may include a PMOSFET region PR and an NMOSFET region NR. The PMOSFET and NMOSFET regions PR and NR may be defined by a trench TR, which is formed in an upper portion of the substrate 100. For example, the trench TR may be located between the PMOSFET and NMOSFET regions PR and NR. The PMOSFET and NMOSFET regions PR and NR may be spaced apart from each other, in a first direction D1, with the trench TR interposed therebetween.

A first active pattern AP1 and a second active pattern AP2 may be respectively provided on the PMOSFET and NMOSFET regions PR and NR of the substrate 100. The first active pattern AP1 and the second active pattern AP2 may be defined by the trench TR. The first and second active patterns AP1 and AP2 may be extended lengthwise in a second direction D2, which is perpendicular to the first direction D1 and parallel to a top surface of the substrate 100. Each of the first and second active patterns AP1 and AP2 may be a vertically-protruding upper portion of the substrate 100. For example, each of the first and second active patterns AP1 and AP2 may protrude from the substrate 100 in a third direction D3, which is perpendicular to the first and second directions D1 and D2 and the top surface of the substrate 100.

A device isolation layer ST may be provided to fill the trench TR. The device isolation layer ST may cover side surfaces of the first and second active patterns AP1 and AP2. For example, the device isolation layer ST may contact the side surfaces of the first and second active patterns AP1 and AP2. In an embodiment, the device isolation layer ST may include a silicon oxide layer. The term "contact," as used herein, refers to a direct connection (i.e., touching) unless the context indicates otherwise.

The first active pattern AP1 may include a first channel pattern CH1 provided at an upper portion thereof. The second active pattern AP2 may include a second channel pattern CH2 provided at an upper portion thereof. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or may include at least one of silicon (Si), germanium (Ge), or silicon-germanium (SiGe). In an embodiment, each of the first to third semiconductor patterns SP1, SP2, and SP3 may be formed of or may include silicon (Si).

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. For example, the pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth process. As an example, each of the first and second source/drain patterns SD1 and SD2 may have a top surface that is located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may be formed of or may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or may include the same semiconductor material (e.g., Si) as the substrate 100.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A.

The first semiconductor layer SEL1 may cover an inner surface of a first recess RS1. In an embodiment, the first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have 'U'-shaped section, due to a sectional profile of the first recess RS1.

In another embodiment, the thickness of the first semiconductor layer SEL1 may be substantially unchanged regardless of a vertical position. For example, the first semiconductor layer SEL1 may have a substantially uniform thickness. For example, a thickness of the first semiconductor layer SEL1, which is measured in the third direction D3 at a bottom level of the first recess RS1, may be substantially equal to a thickness of the first semiconductor layer SEL1, which is measured in the second direction D2 at the top level of the first recess RS1.

The second semiconductor layer SEL2 may fill a remaining space of the first recess RS1 excluding the first semiconductor layer SELL A volume of the second semiconductor layer SEL2 may be larger than a volume of the first semiconductor layer SEL1. For example, a ratio of the volume of the second semiconductor layer SEL2 to a total volume of the first source/drain pattern SD1 may be greater than a ratio of the volume of the first semiconductor layer SEL1 to the total volume of the first source/drain pattern SD1.

Each of the first and second semiconductor layers SEL1 and SEL2 may be formed of or may include a semiconductor material whose lattice constant is greater than that of the semiconductor material of the substrate 100. As an example, in the case where the substrate 100 is formed of or includes silicon (Si), the first and second semiconductor layers SEL1 and SEL2 may be formed of or may include silicon-germanium (SiGe). A lattice constant of germanium (Ge) may be larger than that of silicon (Si).

In detail, the first semiconductor layer SEL1 may be provided to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near a bottom level of the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be greater than that in the first semiconductor layer SEL1. In an embodiment, each of the first and second semiconductor layers SEL1 and SEL2 may further contain another impurity (e.g., at least one of P, As, and C).

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may easily occur on the bottom of the first recess RS1. Thus, to prevent the stacking fault, the first semiconductor layer SEL1 may be provided to have a relatively large thickness near the bottom of the first recess RS1.

The first semiconductor layer SEL1 may protect the second semiconductor layer SEL2, during a process of replacing sacrificial layers SAL (e.g., see FIG. 5B) with first to third portions PO1, PO2, and PO3 of a gate electrode GE. For example, the first semiconductor layer SEL1 may prevent the second semiconductor layer SEL2 from being undesirably etched by an etching material, which is used to remove the sacrificial layers SAL.

The gate electrodes GE may be provided to cross the first and second active patterns AP1 and AP2 and to extend lengthwise in the first direction D1. The gate electrodes GE may be arranged with a first pitch in the second direction D2. Each of the gate electrodes GE may be overlapped with the first and second channel patterns CH1 and CH2, when viewed in a plan view. For example, each of the gate electrodes GE may be above a corresponding one of the first and second channel patterns CH1 and CH2, overlapping the first and second channel patterns CH1 and CH2 in the third direction D3.

The gate electrode GE may include the first portion PO1 interposed between the substrate 100 and the first semiconductor pattern SP1, the second portion PO2 interposed between the first semiconductor pattern SP1 and the second semiconductor pattern SP2, the third portion PO3 interposed between the second semiconductor pattern SP2 and the third semiconductor pattern SP3, and a fourth portion PO4 provided on the third semiconductor pattern SP3.

Referring back to FIG. 2A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 2D, the gate electrode GE may be provided on a top surface TS, a bottom surface BS, and opposite side surfaces SW of each of the first to third semiconductor patterns SP1, SP2, and SP3. For example, the transistor of the logic cell region LCR according to the present embodiment may be a three-dimensional field effect transistor (e.g., MBCFET), in which the gate electrode GE is provided to three-dimensionally surround the channel pattern.

Referring back to FIGS. 1 and 2A to 2D, a pair of gate spacers GS may be respectively disposed on opposite side surfaces of the fourth portion PO4 of the gate electrode GE. The gate spacers GS may be extended lengthwise along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or may include at least one of SiCN, SiCON, or SiN. As another example, the gate spacers GS may be a multi-layered structure, which includes at least two different materials selected from SiCN, SiCON, and SiN.

A gate capping pattern GP may be provided on the gate electrode GE. The gate capping pattern GP may be extended lengthwise along the gate electrode GE and in the first direction D1. A top surface of the gate capping pattern GP may be coplanar with a top surface of the gate spacer GS. The gate capping pattern GP may contact inner side surfaces of the gate spacers GS. The gate capping pattern GP may be formed of or may include a material having an etch selectivity with respect to first and second interlayer insulating layers 110 and 120, which will be described below. For example, the gate capping patterns GP may be formed of or may include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may contact the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE, contacting the top surface of the device isolation layer ST (e.g., see FIG. 2D). The gate insulating layer GI may contact inner side surfaces of the gate spacers GS.

In an embodiment, the gate electrode GE may include a first metal pattern and a second metal pattern on the first metal pattern, although not shown. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is compose of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of stacked work-function metal layers.

The second metal pattern may be formed of or may include a metallic material whose resistance is lower than the first metal pattern. For example, the second metal pattern may include at least one metallic material, which is selected from the group consisting of tungsten (W), aluminum (Al), titanium (Ti), and tantalum (Ta). For example, the fourth portion PO4 of the gate electrode GE may include the first metal pattern and the second metal pattern on the first metal pattern.

In an embodiment, the gate insulating layer GI may include a silicon oxide layer, a silicon oxynitride layer, and/or a high-k dielectric layer. For example, the gate insulating layer GI may have a structure, in which a silicon oxide layer and a high-k dielectric layer are stacked. The high-k dielectric layer may be formed of or may include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or may include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 at % to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or may include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or may include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property only when its thickness is in a specific range. In an embodiment, the ferroelectric layer may have a thickness ranging from 0.5 nm to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIG. 2B, inner spacers IP may be provided on the NMOSFET region NR. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. The second interlayer insulating layer 120 may be formed on the first interlayer insulating layer 110 to cover the gate capping pattern GP. In some embodiments, the second interlayer insulating layer 120 may contact top surfaces of the first interlayer insulating layer 110, the gate capping pattern GP, and the gate spacers GS. In an embodiment, at least one of the first and second interlayer insulating layers 110 and 120 may include a silicon oxide layer.

A pair of dividing structures DB, which are opposite to each other in the second direction D2, may be provided at both sides of the logic cell LC. The division structure DB may be extended lengthwise in the first direction D1 and parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. For example, bottom surfaces of the division structures DB may be at a lower vertical level than top surfaces of the first and second active patterns AP1 and AP2. In some embodiments, the bottom surfaces of the division structures DB may be at a lower vertical level than bottom surfaces of the first and second source/drain patterns SD1 and SD2. The dividing structure DB may separate the PMOSFET and NMOSFET regions PR and NR of the logic cell LC from an active region of another logic cell adjacent thereto.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extended lengthwise in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of the side surface of the gate spacer GS, contacting the side surface of the gate spacer GS. Although not shown, the active contact AC may cover a portion of the top surface of the gate capping pattern GP, contacting the top surface of the gate capping pattern GP.

Silicide patterns SC may be respectively interposed between the active contact AC and the first source/drain pattern SD1 and between the active contact AC and the second source/drain pattern SD2. The silicide patterns SC may contact bottom and side surfaces of the active contacts AC. The active contact AC may be electrically connected to the source/drain pattern SD1 or SD2 through the silicide pattern SC. The silicide pattern SC may be formed of or may include at least one of metal silicide materials (e.g., titanium silicide, tantalum silicide, tungsten silicide, nickel silicide, and cobalt silicide).

A gate contact GC may be provided to penetrate the second interlayer insulating layer 120 and the gate capping pattern GP and may be electrically connected to the gate electrode GE. Referring to FIG. 2B, an upper insulating pattern UIP may be provided to fill an upper region of each of the active contacts AC, which are adjacent to the gate contact GC. Accordingly, it may be possible to prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or may include at least one of metallic materials (e.g., aluminum, copper, tungsten, molybdenum, and cobalt). The barrier pattern BM may be provided to cover side and bottom surfaces of the conductive pattern FM, contacting the side and bottom surfaces of the conductive pattern FM. In an embodiment, the barrier pattern BM may include a metal layer and a metal nitride layer. The metal layer may be formed of or may include at least one of titanium, tantalum, tungsten, nickel, cobalt, or platinum. The metal nitride layer may be formed of or may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. The first metal layer M1 may include a first lower power line M1_R1, a second lower power line M1_R2, and lower interconnection lines M1_I.

Each of the first and second lower power lines M1_R1 and M1_R2 may be extended lengthwise in the second direction D2 to cross the logic cell LC. In detail, a first cell border CB1 extending in the second direction D2 may be defined in the logic cell LC. A second cell border CB2 may be defined in a region of the logic cell LC opposite to the first cell border CB1. The first lower power line M1_R1 may be disposed on the first cell border CB1. The first lower power line M1_R1 may be extended lengthwise along the first cell border CB1 and in the second direction D2. The first lower power line M1_R1 may correspond to positive supply voltage VDD. The second lower power line M1_R2 may be disposed on the second cell border CB2. The second lower power line M1_R2 may be extended lengthwise along the second cell border CB2 and in the second direction D2. The second lower power line M1_R2 may correspond to ground voltage VSS.

The lower interconnection lines M1_I may be disposed between the first and second lower power lines M1_R1 and M1_R2. The lower interconnection lines M1_I may be line- or bar-shaped patterns extending lengthwise in the second direction D2. The lower interconnection lines M1_I may be arranged with a second pitch in the first direction D1. In an embodiment, the second pitch may be smaller than the first pitch.

The first metal layer M1 may further include lower vias VI1. The lower vias VI1 may be provided below the interconnection lines M1_R1, M1_R2, and M1_I of the first metal layer M1. The lower vias VI1 may be respectively interposed between the active contacts AC and the interconnection lines M1_R1, M1_R2, and M1_I of the first metal layer M1. In addition, the lower vias VD may be respectively interposed between the gate contacts GC and the interconnection lines M1_R1, M1_R2, and M1_I of the first metal layer M1. For example, the lower vias VI1 may contact top surfaces of the active contacts AC and the gate contacts GC and bottom surfaces of the interconnection lines M1_R1, M1_R2, and M1_I of the first metal layer M1.

The interconnection line M1_R1, M1_R2, or M1_I of the first metal layer M1 and the lower via VI1 thereunder may be formed by separate processes. For example, each of the interconnection line M1_R1, M1_R2, or M1_I and the lower via VI1 may be formed by a single damascene process. The semiconductor device according to the present embodiment may be fabricated using a sub-20 nm process.

A second metal layer M2 may be provided in a fourth interlayer insulating layer 140. The second metal layer M2 may include upper interconnection lines M2_I. Each of the upper interconnection lines M2_I of the second metal layer M2 may be a line- or bar-shaped pattern extending lengthwise in the first direction D1. For example, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may further include upper vias VI2. The upper vias VI2 may be provided below the upper interconnection lines M2_I. The upper vias VI2 may be respectively interposed between the upper interconnection lines M2_I and the interconnection lines M1_R1, M1_R2, and M1_I of the first metal layer M1. For example, the upper vias VI2 may contact bottom surfaces of the upper interconnection lines M2_I and top surfaces of the interconnection lines M1_R1, M1_R2, and M1_I of the first metal layer M1.

The upper interconnection line M2_I of the second metal layer M2 and the upper via VI2 thereunder may be formed by the same process and may form a single object. For example, the upper interconnection line M2_I and the upper via VI2 of the second metal layer M2 may be formed by a dual damascene process.

The lower interconnection lines M1_I of the first metal layer M1 may be formed of or may include a conductive material that is the same as or different from the upper interconnection line M2_I of the second metal layer M2. For example, the interconnection lines of the first and second metal layers M1 and M2 may be formed of or may include at least one of metallic materials (e.g., aluminum, copper, tungsten, molybdenum, and cobalt). Although not shown, a plurality of stacked metal layers (e.g., M3, M4, M5, and so forth) may be further disposed on the fourth interlayer insulating layer 140. Each of the stacked metal layers may include routing lines.

The first semiconductor pattern SP1, the first source/drain pattern SD1, and the gate electrode GE on the PMOSFET region PR will be described in more detail with reference to FIGS. 3A and 3B. In detail, FIG. 3A may be a plan view of a semiconductor device which is obtained when the semiconductor device is planarized to a level (i.e., the line M-M' of FIG. 2A) of the second portion PO2 of the gate electrode GE. FIG. 3B may be a plan view of the semiconductor device which is obtained when the semiconductor device is planarized to a level (i.e., the line N-N' of FIG. 2A) of the first semiconductor pattern SP1.

The largest width of the first semiconductor pattern SP1 in the first direction D1 may be a first width W1. Since the second portion PO2 of the gate electrode GE is vertically overlapped with the first semiconductor pattern SP1, it may have the first width W1 in the first direction D1.

Referring to FIG. 3B, the first semiconductor pattern SP1 may include a first side surface SW1 and a second side surface SW2. The first side surface SW1 and the second side surface SW2 may be opposite to each other in the first direction D1. The first and second side surfaces SW1 and SW2 may be covered with the gate insulating layer GI. The gate insulating layer GI may contact the first and second side surfaces SW1 and SW2. The gate electrode GE may be adjacent to the first and second side surfaces SW1 and SW2, with the gate insulating layer GI interposed therebetween.

In an embodiment, the first semiconductor pattern SP1 may contain silicon (Si). For example, a concentration of silicon (Si) in the first semiconductor pattern SP1 may be equal to or higher than 97 at %. The first semiconductor pattern SP1 may further contain germanium (Ge) serving as an impurity. A concentration of germanium (Ge) in the first semiconductor pattern SP1 may be changed in a direction from the first side surface SW1 toward the second side surface SW2. For example, the concentration of germanium (Ge) in the first semiconductor pattern SP1 may decrease from the first side surface SW1 to a center region of the first semiconductor pattern SP1, may have the minimum value at the center region, and may increase from the center region toward the second side surface SW2. For example, the concentration of germanium (Ge) in the first semiconductor pattern SP1 may be highest near the first and second side surfaces SW1 and SW2.

Referring back to FIGS. 3A and 3B, the first source/drain pattern SD1 may be interposed between an adjacent pair of the first semiconductor patterns SP1. The first source/drain pattern SD1 may be interposed between the second portions PO2 of an adjacent pair of the gate electrodes GE. The first source/drain pattern SD1 may include the first semiconductor layer SEL1, which is located adjacent to the pair of first semiconductor patterns SP1, and the second semiconductor layer SEL2, which is located at its center. The first semiconductor patterns SP1 may be adjacent to the second portions PO2.

The first semiconductor layer SEL1 of the first source/drain pattern SD1 may be in direct contact with the first semiconductor pattern SP1. The first semiconductor layer SEL1 may be in direct contact with the gate insulating layer GI on the second portion PO2 of the gate electrode GE. For example, the gate insulating layer GI may be interposed between the second portion PO2 of the gate electrode GE and the first semiconductor layer SEL1. The largest width of the first semiconductor layer SEL1 in the first direction D1 may be a second width W2. The second width W2 may be larger than the first width W1.

At least a portion of the second semiconductor layer SEL2 may be interposed between an adjacent pair of the gate spacers GS. The largest width of the second semiconductor layer SEL2 in the first direction D1 may be a third width W3. The third width W3 may be larger than the second width W2.

The first semiconductor layer SEL1 may include a center portion CTP and edge portions EDP at both sides of the center portion CTP. The center portion CTP may be in contact with the first semiconductor pattern SP1. The center portion CTP may be directly adjacent to the second portion PO2 of the gate electrode GE. Each of the edge portions EDP may cover an end portion EN of the gate spacer GS. For example, the center portion CTP may overlap the first semiconductor pattern SP1 in the second direction D2, whereas the edge portions EDP may not overlap the first semiconductor pattern SP1 in the second direction D2.

The edge portion EDP of the first semiconductor layer SEL1 may include a first outer side surface OSF1, which is in contact with the gate insulating layer GI, and the center portion CTP of the first semiconductor layer SEL1 may include a second outer side surface OSF2, which is in contact with the gate insulating layer GI (e.g., see FIG. 3A). The second outer side surface OSF2 of the center portion CTP may be in contact with the first semiconductor pattern SP1 (e.g., see FIG. 3B).

The second outer side surface OSF2 may be further recessed toward the second semiconductor layer SEL2, compared with the first outer side surface OSF1. For example, the second outer side surface OSF2 may be further recessed in the second direction D2, compared with the first outer side surface OSF1. An outer side surface of the first semiconductor layer SEL1 may include the first outer side surface OSF1 and the second outer side surface OSF2. Due to the afore-described shapes of the first and second outer side surfaces OSF1 and OSF2, the outer side surface of the first semiconductor layer SEL1 may have a profile that is concave toward the second semiconductor layer SEL2.

The edge portion EDP of the first semiconductor layer SEL1 may have a first thickness T1 in the second direction D2. The first thickness T1 may be a maximum thickness of the edge portion EDP in the second direction D2. The center portion CTP of the first semiconductor layer SEL1 may have a second thickness T2 in the second direction D2. The second thickness T2 may be a maximum thickness of the center portion CTP in the second direction D2. The second thickness T2 may be equal to or larger than the first thickness T1. A ratio T1/T2 of the first thickness T1 to the second thickness T2 may range from 0.5 to 1. For example, the first thickness T1 of the edge portion EDP may be sufficiently thick to be similar to the second thickness T2 of the center portion CTP.

Figure 2A:
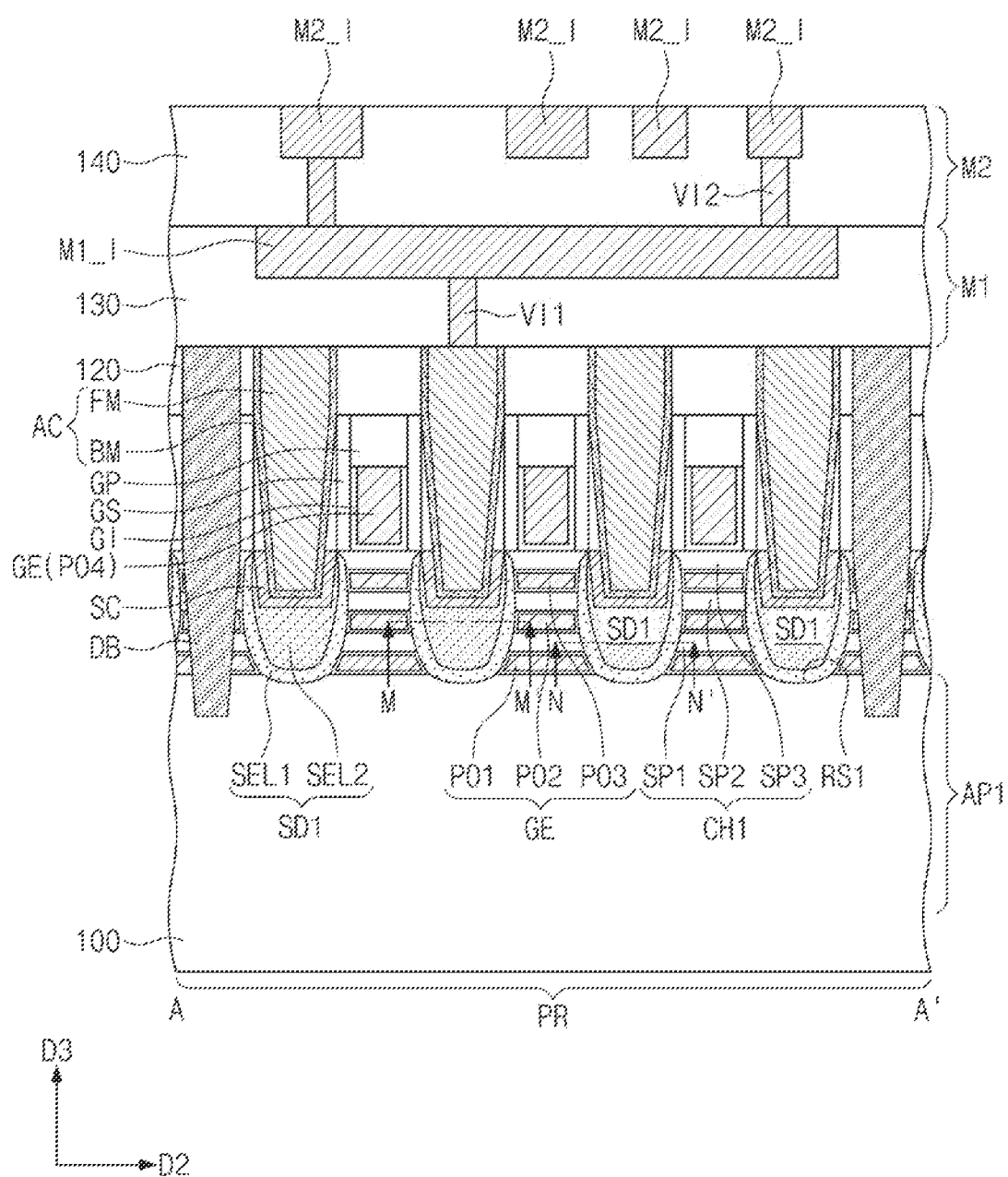
FIGS. 2A, 2B, 2C, 2D, 2E, and 2F are sectional views, which are respectively taken along lines A-A', B-B', C-C', D-D', E-E', and F-F' of FIG. 1.
Figure 2B:
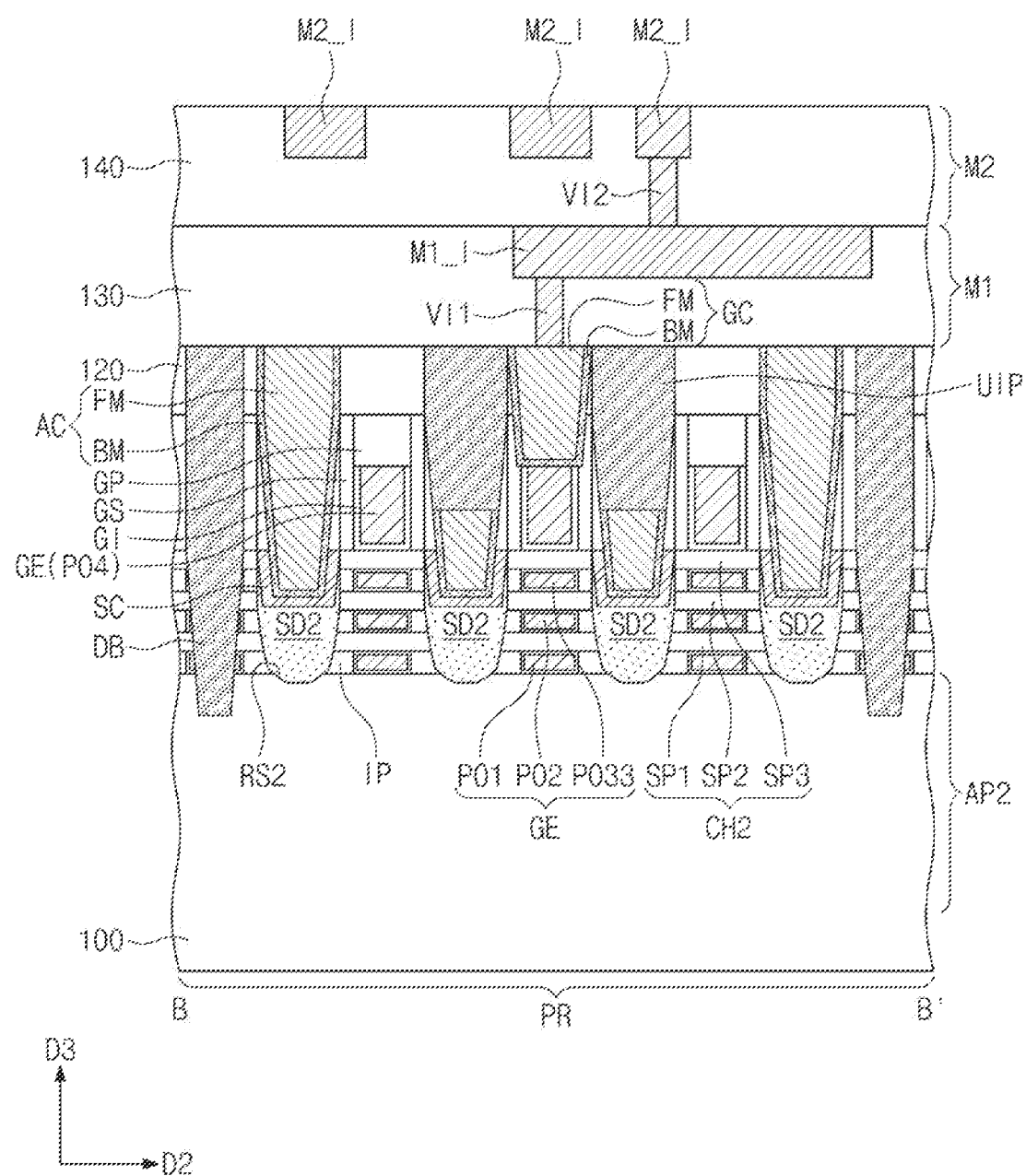
Figure 2C:
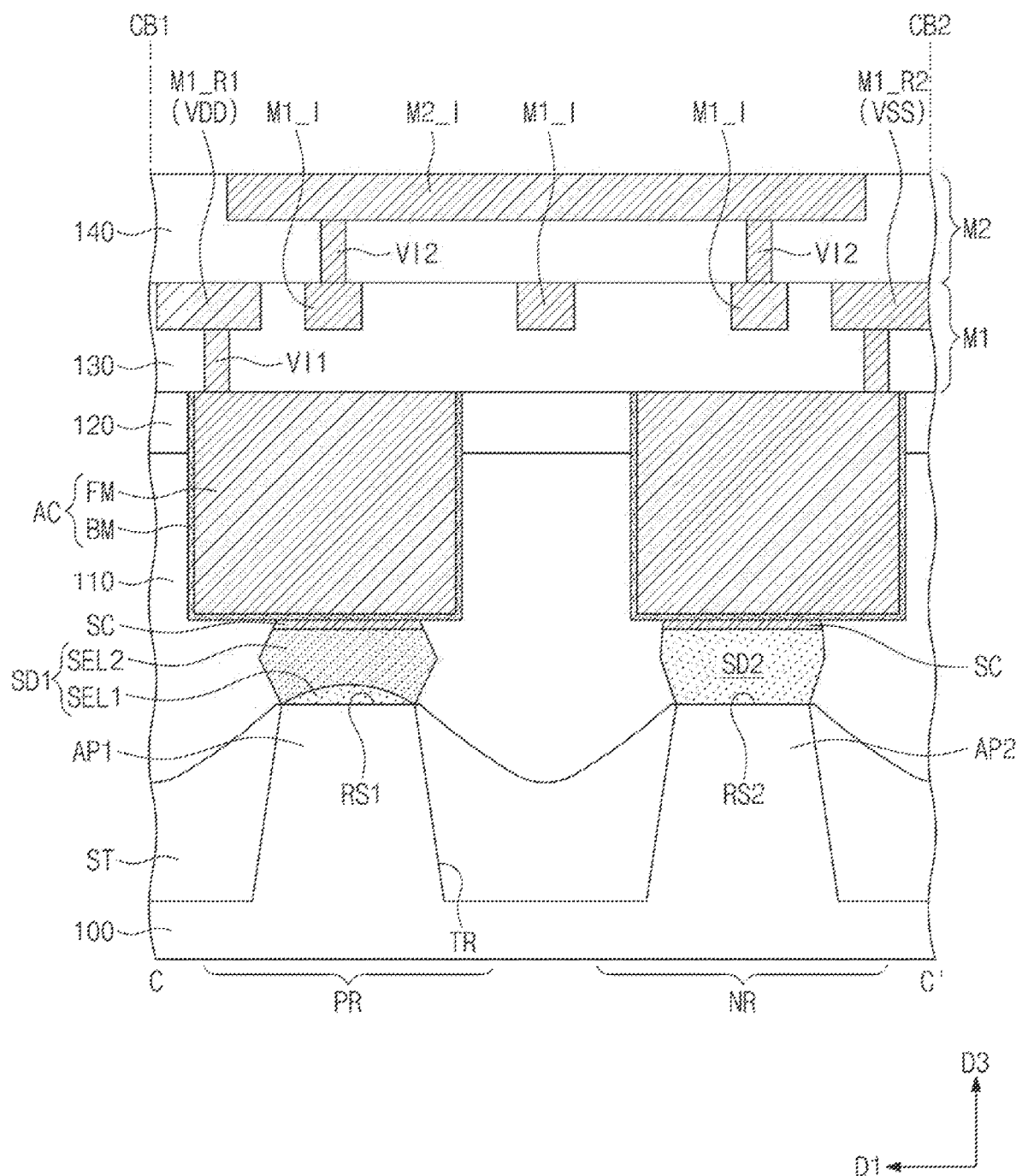
Figure 2D:
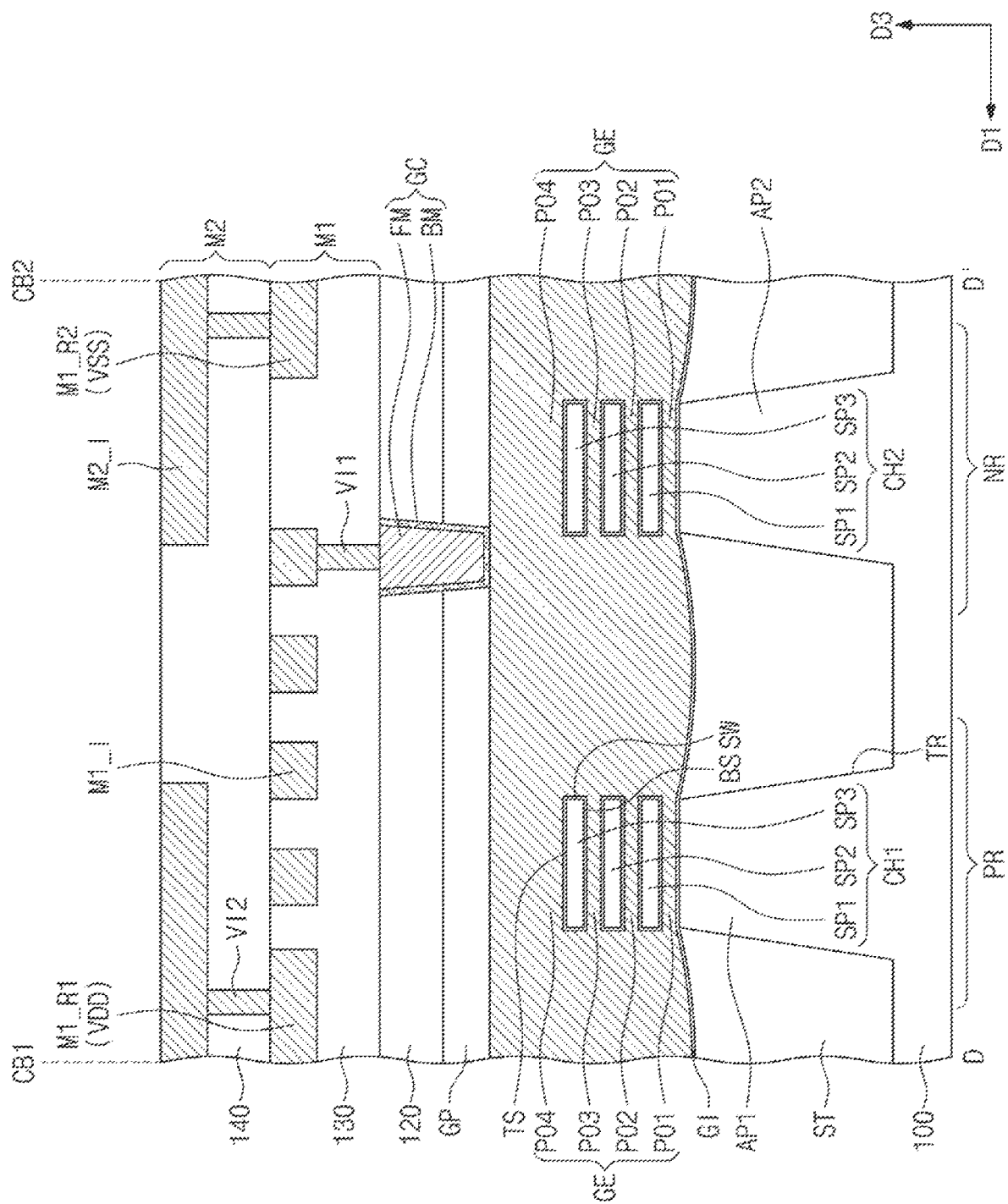
Figure 3A:
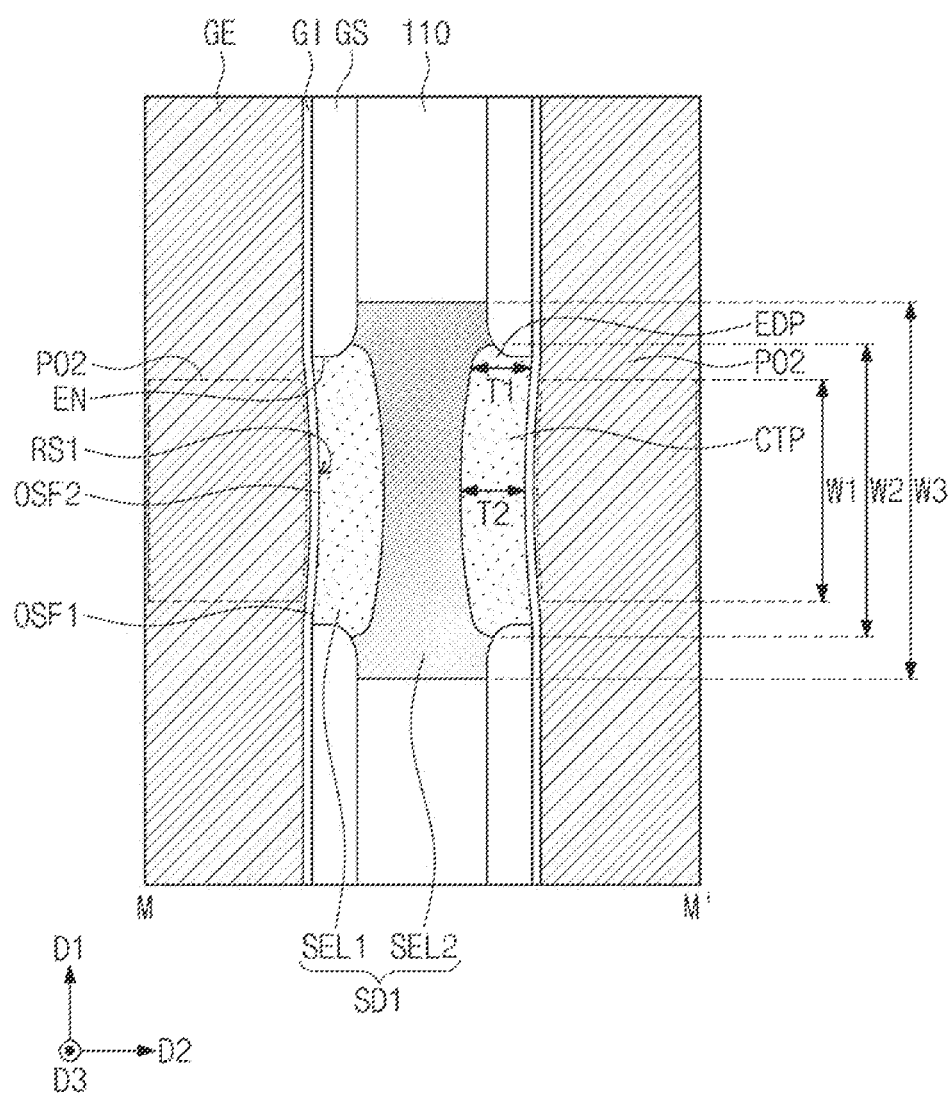
FIG. 3A is a top plan view taken along a line M-M' of FIG. 2A.
Figure 3B:
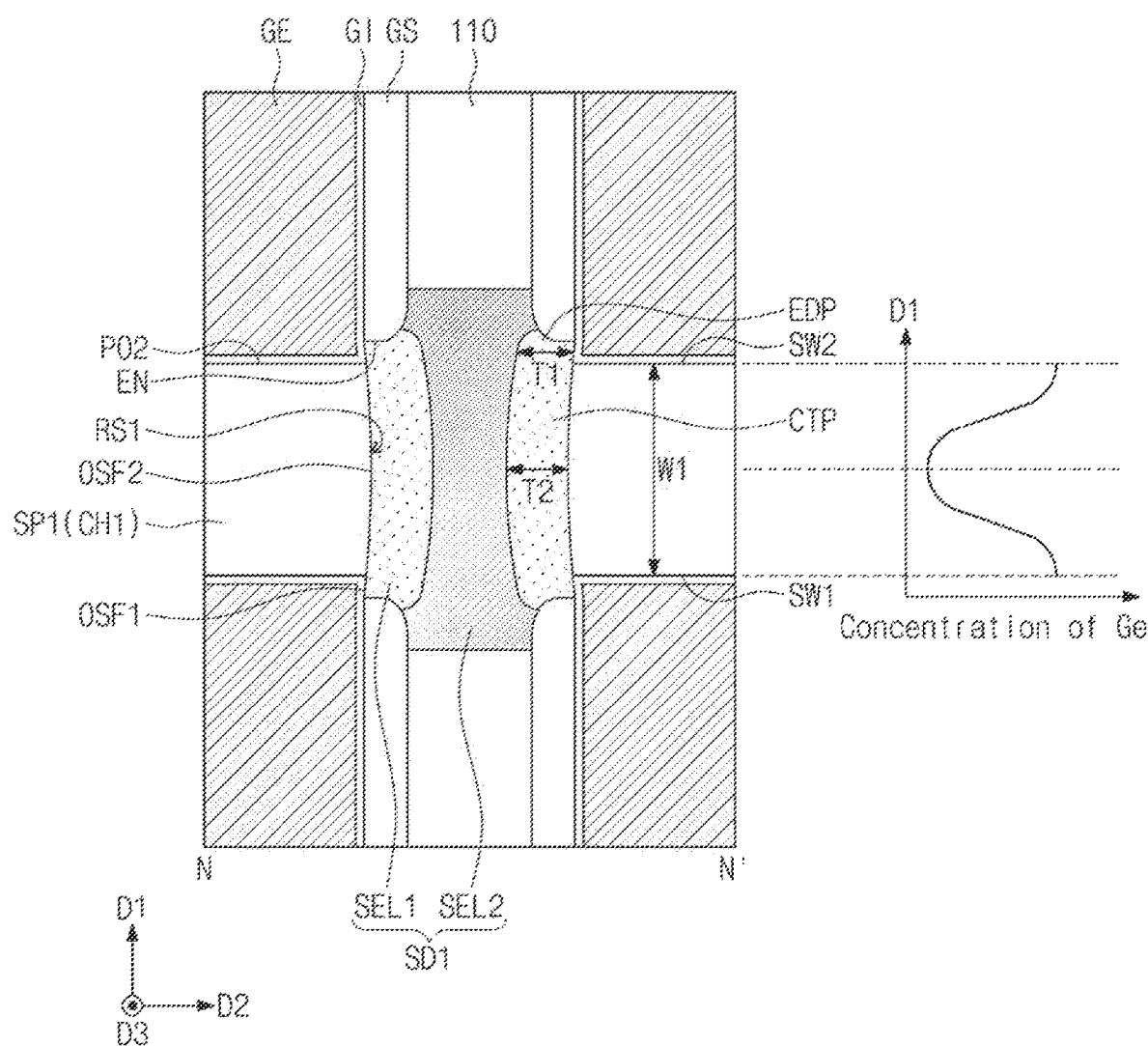
FIG. 3B is a top plan view taken along a line N-N' of FIG. 2A.
Figure 4:
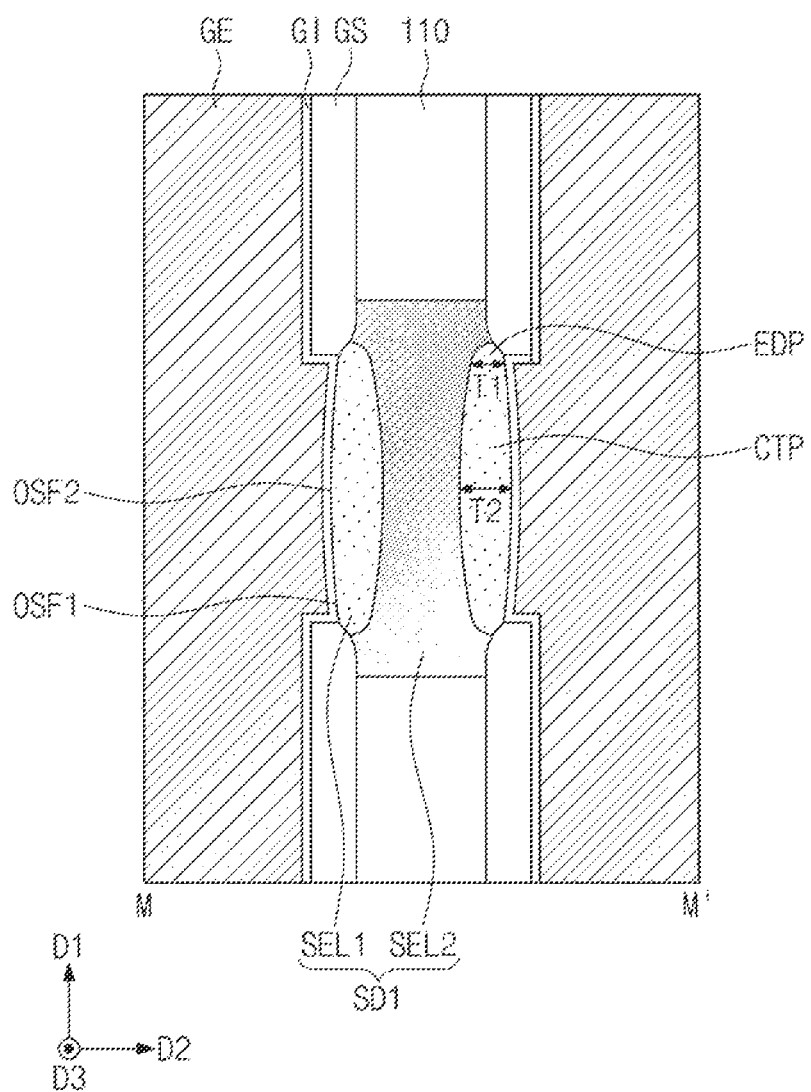
FIG. 4 is a top plan view, which is taken along the line M-M' of FIG. 2A to illustrate a semiconductor device, according to a comparative example.

FIG. 4 is a top plan view, which is taken along the line M-M' of FIG. 2A to illustrate a semiconductor device according to a comparative example. Referring to FIG. 4, the edge portion EDP of the first semiconductor layer SEL1 may include the first outer side surface OSF1, and the center portion CTP of the first semiconductor layer SEL1 may include the second outer side surface OSF2. In the comparative example, the first outer side surface OSF1 may be further recessed toward the second semiconductor layer SEL2, compared with the second outer side surface OSF2. For example, the outer side surfaces OSF1 and OSF2 of the first semiconductor layer SEL1 may have a convex profile in a direction away from the second semiconductor layer SEL2.

The edge portion EDP of the first semiconductor layer SEL1 may have the first thickness T1 in the second direction D2. The center portion CTP of the first semiconductor layer SEL1 may have the second thickness T2 in the second direction D2. In the comparative example, since the outer side surfaces OSF1 and OSF2 of the first semiconductor layer SEL1 have a convex profile, the first thickness T1 may be much smaller than the second thickness T2. For example, the ratio T1/T2 of the first thickness T1 to the second thickness T2 may range from 0.01 to 0.4. For example, the edge portion EDP may be much thinner than the center portion CTP.

In the case where, as illustrated in the comparative example of FIG. 4, the edge portion EDP of the first semiconductor layer SEL1 has a very small thickness, the edge portion EDP may be easily removed during the process of forming the gate electrode GE. If the edge portion EDP is removed, the second semiconductor layer SEL2 may be damaged by an etching material that is supplied through a space formed by the removing of the edge portion. For example, if the edge portion EDP of the first semiconductor layer SEL1 has a relatively small thickness, it may be difficult for the first semiconductor layer SEL1 to protect the second semiconductor layer SEL2. As a result, a process defect may occur in a semiconductor device, and reliability of the semiconductor device may be lowered.

By contrast, since, in the embodiment shown in FIGS. 3A and 3B, the second outer side surface OSF2 of the first semiconductor layer SEL1 is further recessed toward the second semiconductor layer SEL2 compared with the first outer side surface OSF1, the first thickness T1 may have a relatively large value that is close to the second thickness T2. In an embodiment, since the edge portion EDP of the first semiconductor layer SEL1 has a relatively large thickness, the edge portion EDP may not be easily removed during the process of forming the gate electrode GE. The first semiconductor layer SEL1 according to an embodiment of the inventive concept may effectively protect the second semiconductor layer SEL2. As a result, according to an embodiment of the inventive concept, it may be possible to reduce a process defect of a semiconductor device and to improve reliability of the semiconductor device.

Figure 2E:
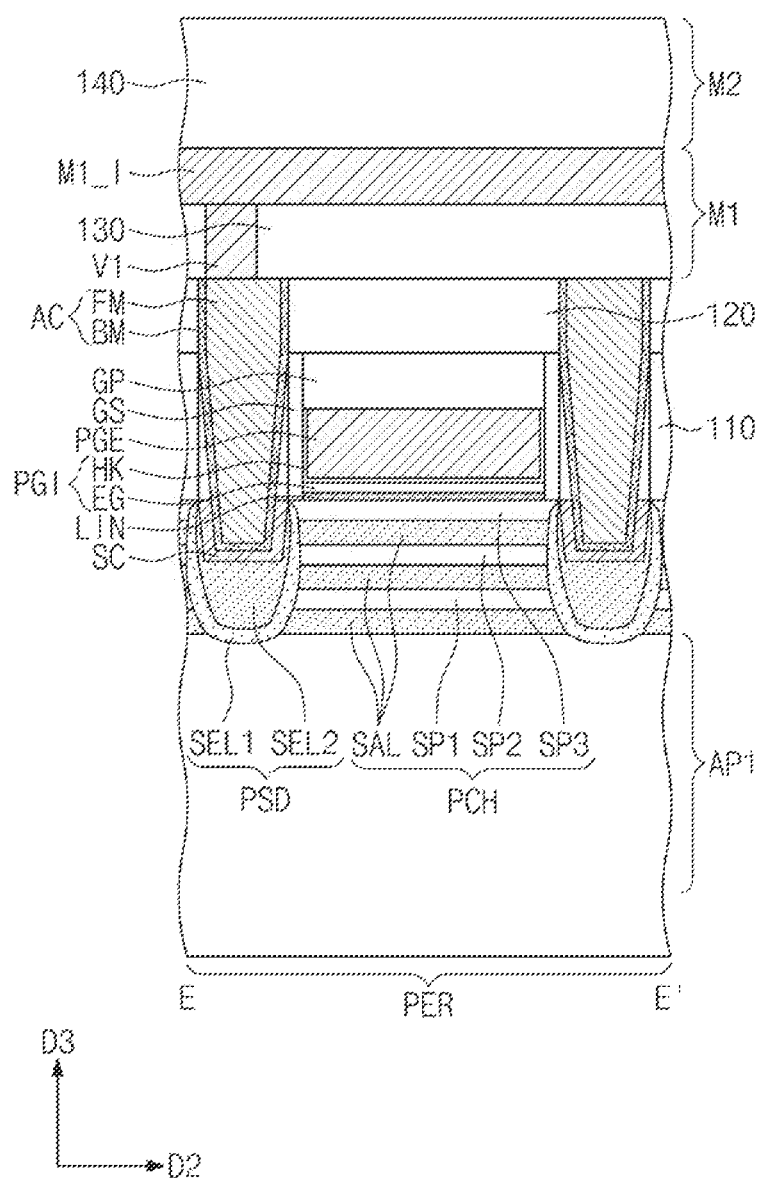
Figure 2F:
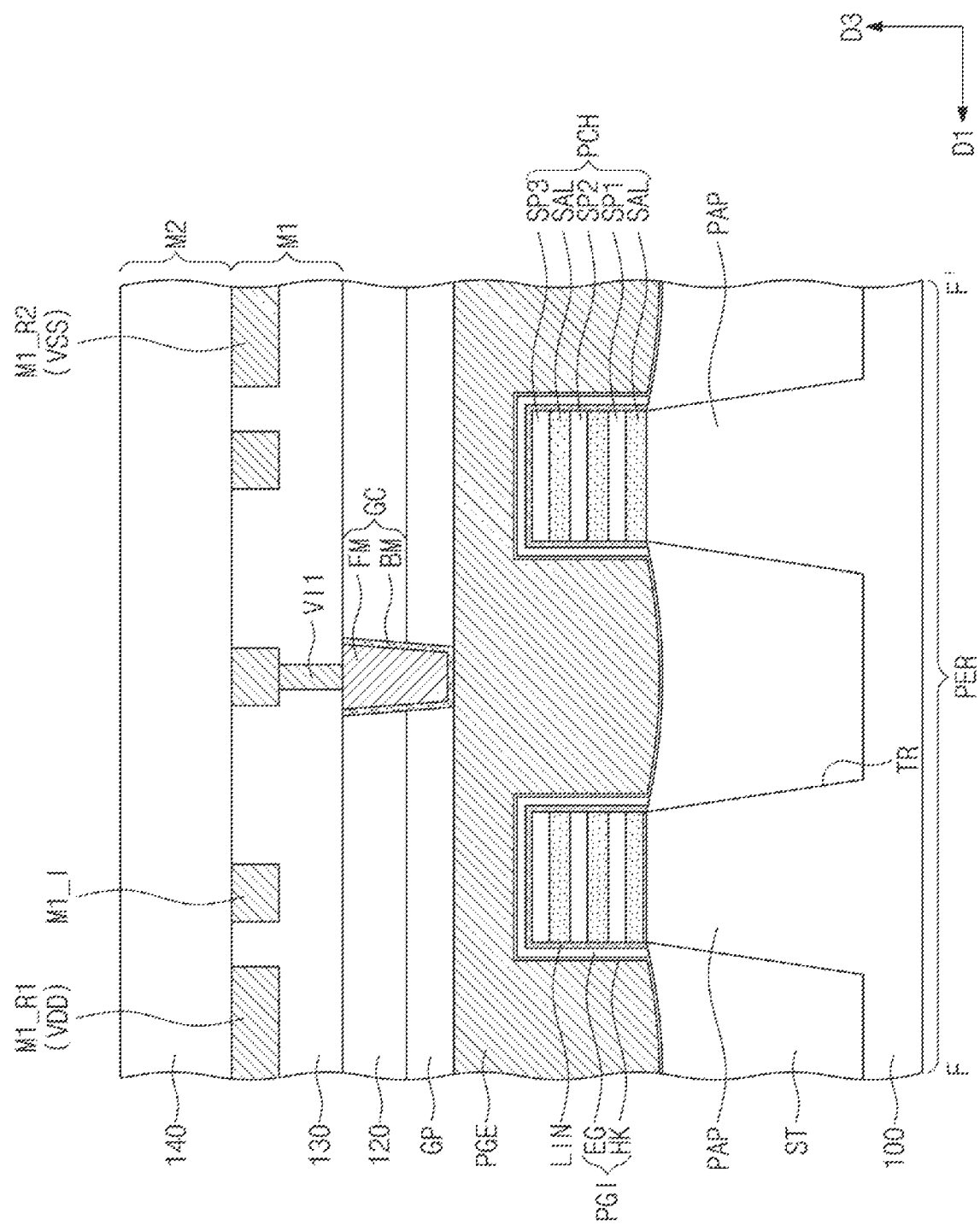

Hereinafter, the peripheral region PER will be described in more detail with reference to FIGS. 1, 2E, and 2F. At least one peripheral active pattern PAP may be provided on the peripheral region PER. The device isolation layer ST may cover a lower side surface of the peripheral active pattern PAP.

The peripheral active pattern PAP may include a peripheral channel pattern PCH provided in an upper portion thereof. The peripheral channel pattern PCH may include the first semiconductor pattern SP1, the second semiconductor pattern SP2, and the third semiconductor pattern SP3, which are sequentially stacked on the peripheral active pattern PAP, and the sacrificial layers SAL, which are interposed between the first to third semiconductor patterns SP1, SP2, and SP3. The semiconductor patterns SP1 to SP3 and the sacrificial layers SAL may be alternately stacked on the peripheral active pattern PAP.

The first to third semiconductor patterns SP1, SP2, and SP3 may be formed of or may include one of silicon (Si), germanium (Ge), and silicon-germanium (SiGe), and the sacrificial layers SAL may be formed of or may include another one of silicon (Si), germanium (Ge), and silicon germanium (SiGe). For example, the first to third semiconductor patterns SP1, SP2, and SP3 may be formed of or may include silicon (Si), and the sacrificial layers SAL may be formed of or may include silicon-germanium (SiGe).

A pair of peripheral source/drain patterns PSD may be provided in an upper portion of the peripheral active pattern PAP. In an embodiment, the peripheral source/drain patterns PSD may be the same as or similar to the first source/drain patterns SD1 on the logic cell region LCR described above. For example, each of the peripheral source/drain patterns PSD may include a first semiconductor layer SEL1 and a second semiconductor layer SEL2, which are sequentially stacked.

A peripheral gate electrode PGE may be extended in the first direction D1 to cross the peripheral active pattern PAP. The peripheral gate electrode PGE may be vertically overlapped with the peripheral channel pattern PCH. The peripheral gate electrode PGE may have a width that is larger than the gate electrode GE on the logic cell region LCR described above.

Referring back to FIG. 2F, the peripheral gate electrode PGE may be provided on a top surface and opposite side surfaces of the peripheral channel pattern PCH. For example, the transistor on the peripheral region PER according to the present embodiment may be a three-dimensional field effect transistor (e.g., FinFET) in which the peripheral gate electrode PGE is provided to three-dimensionally surround the channel pattern.

A liner layer LIN and a peripheral gate insulating layer PGI may be interposed between the peripheral gate electrode PGE and the peripheral channel pattern PCH. The liner layer LIN may directly cover a top surface and opposite side surfaces of the peripheral channel pattern PCH. For example, the liner layer LIN may contact the top surface and opposite side surfaces of the peripheral channel pattern PCH. The peripheral gate insulating layer PGI may be interposed between the liner layer LIN and the peripheral gate electrode PGE.

The liner layer LIN may have a thickness ranging from 1 nm to 5 nm. The liner layer LIN may be formed of or may include silicon-germanium (SiGe) or germanium (Ge). A germanium concentration of the liner layer LIN may be higher than a germanium concentration of the sacrificial layers SAL. The germanium concentration of the liner layer LIN may be higher than the germanium concentration of the sacrificial layers SAL by at least 5 at %. A difference in germanium concentration between the liner layer LIN and the sacrificial layers SAL may be greater than 5 at %. For example, the germanium concentration of the liner layer LIN may range from 35 at % to 100 at %. The germanium concentration of the sacrificial layers SAL may range from 10 at % to 30 at %.

The peripheral gate insulating layer PGI may include an oxide layer EG and a high-k dielectric layer HK on the oxide layer EG and contacting the oxide layer EG. The oxide layer EG may be thicker than the high-k dielectric layer HK. The oxide layer EG may be thicker than the liner layer LIN. As an example, the oxide layer EG may include a silicon oxide layer. The high-k dielectric layer HK may be formed of or may include a high-k dielectric material whose dielectric constant is higher than the oxide layer EG.

The active contacts AC may be provided to penetrate the first and second interlayer insulating layers 110 and 120 and may be electrically connected to the peripheral source/drain patterns PSD, respectively. The gate contact GC may be provided to penetrate the second interlayer insulating layer 120 and the gate capping pattern GP and may be electrically connected to the peripheral gate electrode PGE. The first metal layer M1 may be provided on the second interlayer insulating layer 120. The second metal layer M2 may be provided on the first metal layer M1.

FIGS. 5A to 10D are sectional views illustrating a method of fabricating a semiconductor device according to an embodiment of the inventive concept. In detail, FIGS. 5A, 6A, 7A, 8A, 9A, and 10A are sectional views corresponding to the line A-A' of FIG. 1. FIGS. 7B, 8B, 9B, and 10B are sectional views corresponding to the line B-B' of FIG. 1. FIGS. 7C, 8C, 9C, and 10C are sectional views corresponding to the line C-C' of FIG. 1. FIGS. 5B, 6B, 7D, 8D, 9D, and 10D are sectional views corresponding to the line D-D' of FIG. 1. Hereinafter, the fabrication method performed on the logic cell region LCR will be exemplarily described.

Figure 5A:
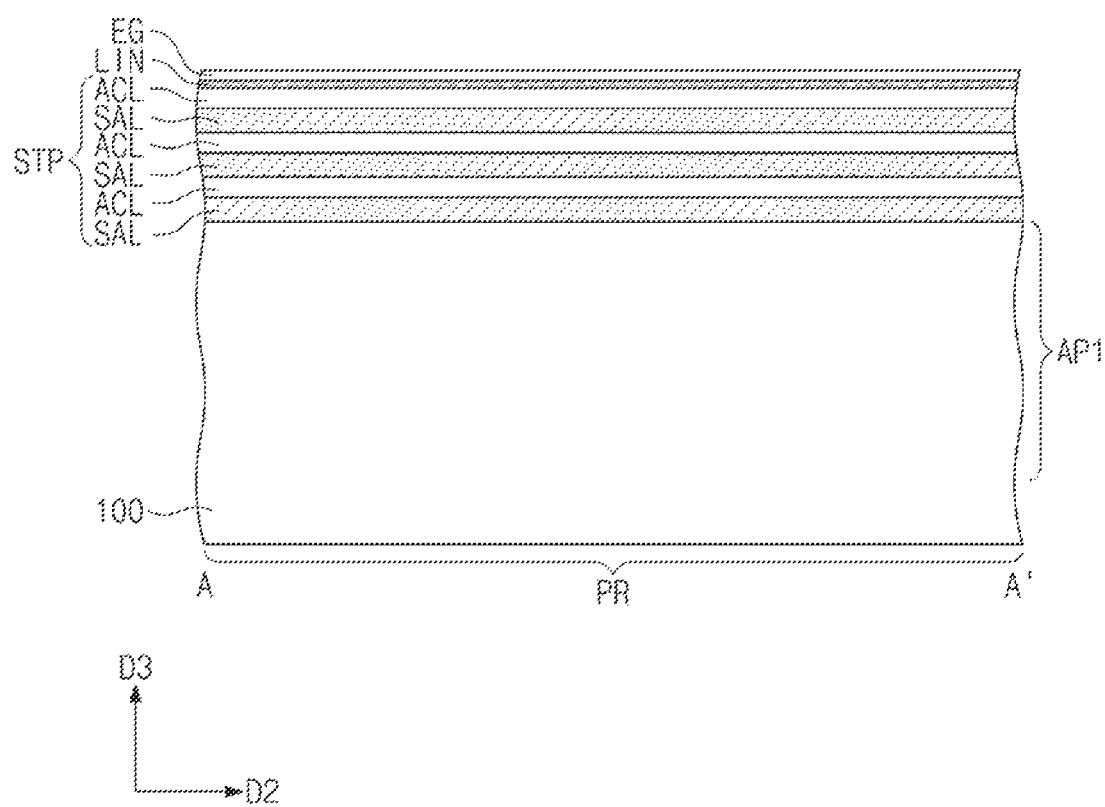
Figure 5B:
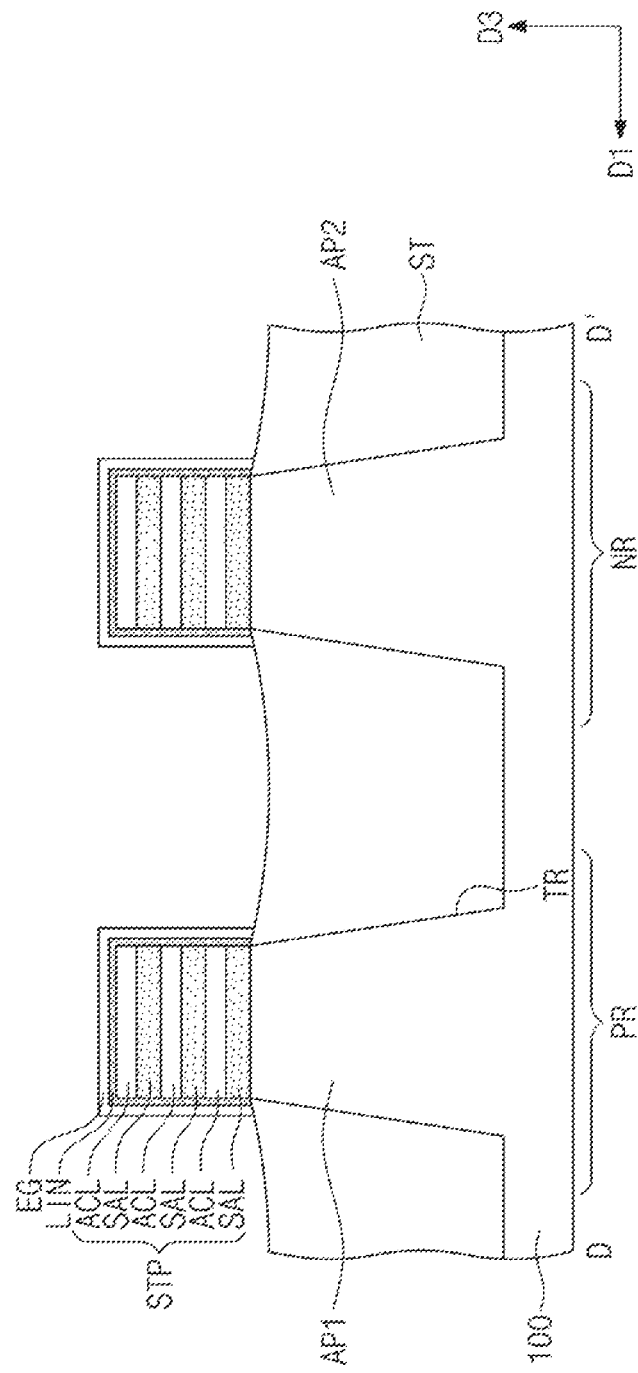

Referring to FIGS. 1, 5A, and 5B, the substrate 100 including the logic cell region LCR may be provided. The logic cell region LCR may include the PMOSFET and NMOSFET regions PR and NR. The sacrificial layers SAL and active layers ACL may be alternately stacked on the substrate 100. The sacrificial layers SAL may be formed of or may include one of silicon (Si), germanium (Ge), and silicon-germanium (SiGe), and the active layers ACL may be formed of or may include another one of silicon (Si), germanium (Ge) and silicon-germanium (SiGe).

For example, the sacrificial layers SAL may be formed of or may include silicon-germanium (SiGe), and the active layers ACL may be formed of or may include silicon (Si). A germanium concentration of each of the sacrificial layers SAL may range from 10 at % to 30 at %.

Mask patterns may be respectively formed on the PMOSFET and NMOSFET regions PR and NR of the substrate 100. The mask patterns may be a line- or bar-shaped pattern extending in the second direction D2.

A patterning process, in which the mask patterns are used as an etch mask, may be performed to form the trench TR defining the first active pattern AP1 and the second active pattern AP2. The first active pattern AP1 and the second active pattern AP2 may be formed on the PMOSFET region PR and the NMOSFET region NR, respectively. A stacking pattern STP may be formed on each of the first and second active patterns AP1 and AP2. The stacking pattern STP may include the sacrificial layers SAL and the active layers ACL, which are alternatingly stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or may include at least one of insulating materials (e.g., silicon oxide). The stacking patterns STP may be placed on the device isolation layer ST and may be exposed to the outside of the device isolation layer ST. For example, the stacking patterns STP may protrude vertically above the device isolation layer ST.

The liner layer LIN and the oxide layer EG may be sequentially formed on the exposed stacking pattern STP which is placed on the device isolation layer ST. The liner layer LIN may be conformally formed to have a thickness ranging from 1 nm to 5 nm. The liner layer LIN may be formed of or may include silicon-germanium (SiGe) or germanium (Ge). A germanium concentration of the liner layer LIN may be higher than a germanium concentration of the sacrificial layers SAL. For example, the germanium concentration of the liner layer LIN may range from 35 at % to 100 at %.

The oxide layer EG may be conformally formed on the liner layer LIN. In an embodiment, the oxide layer EG may be formed to be thicker than the liner layer LIN. In an embodiment, the oxide layer EG may include a silicon oxide layer.

Figure 6A:
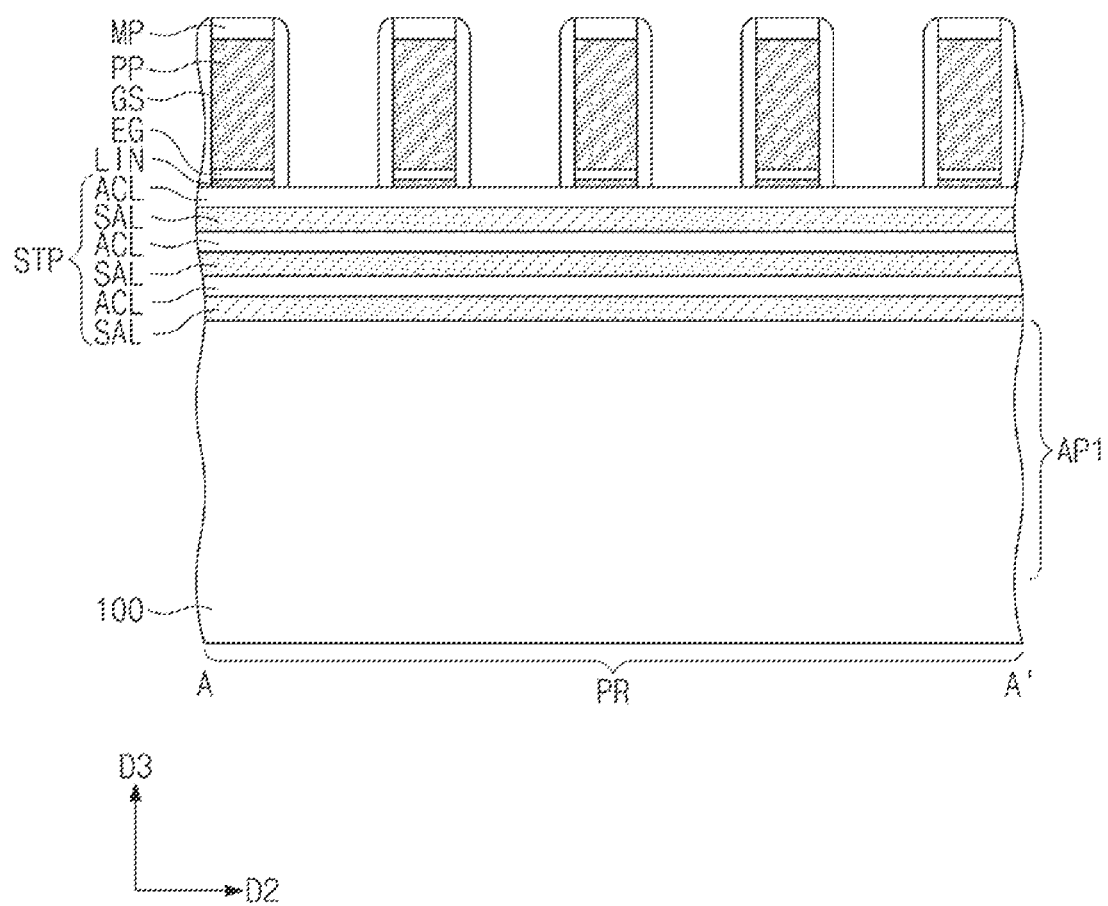

Referring to FIGS. 1, 6A, and 6B, sacrificial patterns PP may be formed on the substrate 100 to cross the stacking patterns STP. Each of the sacrificial patterns PP may be a line- or bar-shaped pattern extending in the first direction D1. The sacrificial patterns PP may be arranged, with a specific pitch, in the second direction D2.

In detail, the formation of the sacrificial patterns PP may include forming a sacrificial film on the substrate 100, forming hard mask patterns MP on the sacrificial film, and patterning the sacrificial film using the hard mask patterns MP as an etch mask. The sacrificial film may be formed of or may include poly silicon. The oxide layer EG and the liner layer LIN, which are placed below the sacrificial film, may also be patterned during the patterning of the sacrificial film using the hard mask patterns MP.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer layer may be formed of or may include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

Referring to FIGS. 1 and 7A to 7D, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may be further recessed at both sides of each of the first and second active patterns AP1 and AP2 (e.g., see FIG. 7C).

In detail, the first recesses RS1 may be formed by etching the stacking pattern STP on the first active pattern AP1 using hard mask patterns MP and the gate spacers GS as an etch mask. The first recess RS1 may be formed between a pair of the sacrificial patterns PP. The second recesses RS2 in the stacking pattern STP on the second active pattern AP2 may be formed by the same method as that for the first recesses RS1.

Between adjacent ones of the first recesses RS1, the first to third semiconductor patterns SP1, SP2, and SP3, which are sequentially stacked, may be formed from the active layers ACL. Between adjacent ones of the second recesses RS2, the first to third semiconductor patterns SP1, SP2, and SP3, which are sequentially stacked, may be formed from the active layers ACL. The first to third semiconductor patterns SP1, SP2, and SP3 between the adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

Referring to FIGS. 1 and 8A to 8D, the first source/drain patterns SD1 may be formed in the first recesses RS1, respectively. In detail, the first semiconductor layer SEL1 may be formed by performing a first SEG process using an inner surface of the first recess RS1 as a seed layer. The first semiconductor layer SEL1 may be grown using the first to third semiconductor patterns SP1, SP2, and SP3, the sacrificial layers SAL, and the substrate 100, which are exposed through the first recess RS1, as a seed layer. As an example, the first SEG process may include a chemical vapor deposition (CVD) process or a molecular beam epitaxy (MBE) process.

The first semiconductor layer SEL1 may be formed of or may include a semiconductor material (e.g., SiGe) having a lattice constant greater than that of the substrate 100. The first semiconductor layer SEL1 may be formed to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

The second source/drain patterns SD2 may be formed in the second recesses RS2, respectively. In detail, the second source/drain pattern SD2 may be formed by a SEG process, in which an inner surface of the second recess RS2 is used as a seed layer. In an embodiment, the second source/drain pattern SD2 may be formed of or may include the same semiconductor material (e.g., Si) as the substrate 100. The second source/drain pattern SD2 may be doped to have a second conductivity type (e.g., n-type). The inner spacers IP may be respectively formed between the second source/drain pattern SD2 and the sacrificial layers SAL.

Referring to FIGS. 1 and 9A to 9D, the first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, the first interlayered insulating layer 110 may have a top surface that is substantially coplanar with the top surfaces of the sacrificial patterns PP and the top surfaces of the gate spacers GS. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

The exposed sacrificial pattern PP, the oxide layer EG, and the liner layer LIN may be removed. As the result of the removal of the sacrificial pattern PP, the oxide layer EG, and the liner layer LIN, an outer region ORG exposing the first and second channel patterns CH1 and CH2 may be formed (e.g., see FIG. 9D).

Since the sacrificial pattern PP, the oxide layer EG, and the liner layer LIN are removed, the sacrificial layers SAL may be exposed through the outer region ORG. Inner regions IRG may be formed by selectively removing the exposed sacrificial layers SAL (e.g., see FIG. 9D). In detail, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may have a high etch rate for silicon-germanium whose germanium concentration is higher than 10 at %.

During the etching process, the sacrificial layers SAL may be removed from the PMOSFET region PR and the NMOSFET region NR. The etching process may be a wet etching process. An etchant material, which is used in the etching process, may be chosen to quickly remove the sacrificial layer SAL having a relatively high germanium concentration. Meanwhile, during the etching process, the first source/drain pattern SD1 of the PMOSFET region PR may be protected by the first semiconductor layer SEL1 having a relatively low germanium concentration.

Referring back to FIG. 9D, since the sacrificial layers SAL are selectively removed, the first to third semiconductor patterns SP1, SP2, and SP3, which are stacked to be spaced apart from each other, may be left on each of the first and second active patterns AP1 and AP2. Empty regions, which are formed by removing the sacrificial layers SAL, may form first to third inner regions IRG1, IRG2, and IRG3, respectively. In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 1 and 10A to 10D, the gate insulating layer GI may be conformally formed on the exposed first to third semiconductor patterns SP1, SP2, and SP3. The gate electrode GE may be formed on the gate insulating layer GI. The gate capping pattern GP may be formed on the gate electrode GE.

The gate electrode GE may be formed to fill the first to third inner regions IRG1, IRG2, and IRG3 and the outer region ORG. The gate electrode GE may include the first, second, and third portions PO1, PO2, and PO3 filling the first to third inner regions IRG1, IRG2, and IRG3, respectively. The gate electrode GE may include the fourth portion PO4 filling the outer region ORG.

Referring back to FIGS. 1 and 2A to 2D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed at both sides of the logic cell LC. The division structure DB may penetrate the second interlayer insulating layer 120 and the gate electrode GE and may be extended vertically into the active pattern AP1 or AP2. The division structure DB may be formed of or may include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

The process described with reference to FIGS. 5A to 10D may be performed on the peripheral region PER of the substrate 100. However, the removal process of the oxide layer EG, the liner layer LIN, and the sacrificial layers SAL, which is one of the processes previously described with reference to FIGS. 9A to 9D, may not be performed on the peripheral region PER. Thus, the oxide layer EG, the liner layer LIN, and the sacrificial layers SAL may be left on the peripheral region PER.

Figure 11A:
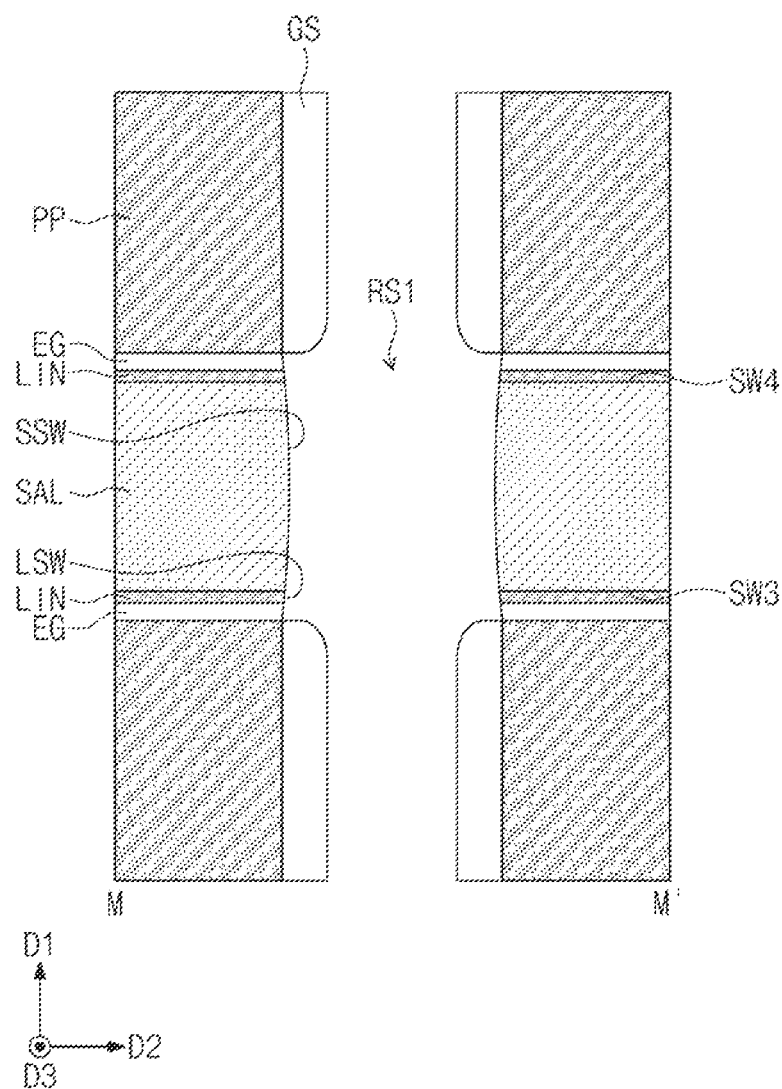
FIGS. 11A-11B, 12A-12B, 13A-13B, and 14A-14B are plan views illustrating a method of forming a first source/drain pattern on a PMOSFET region, according to an example embodiment of the inventive concept.
Figure 12A:
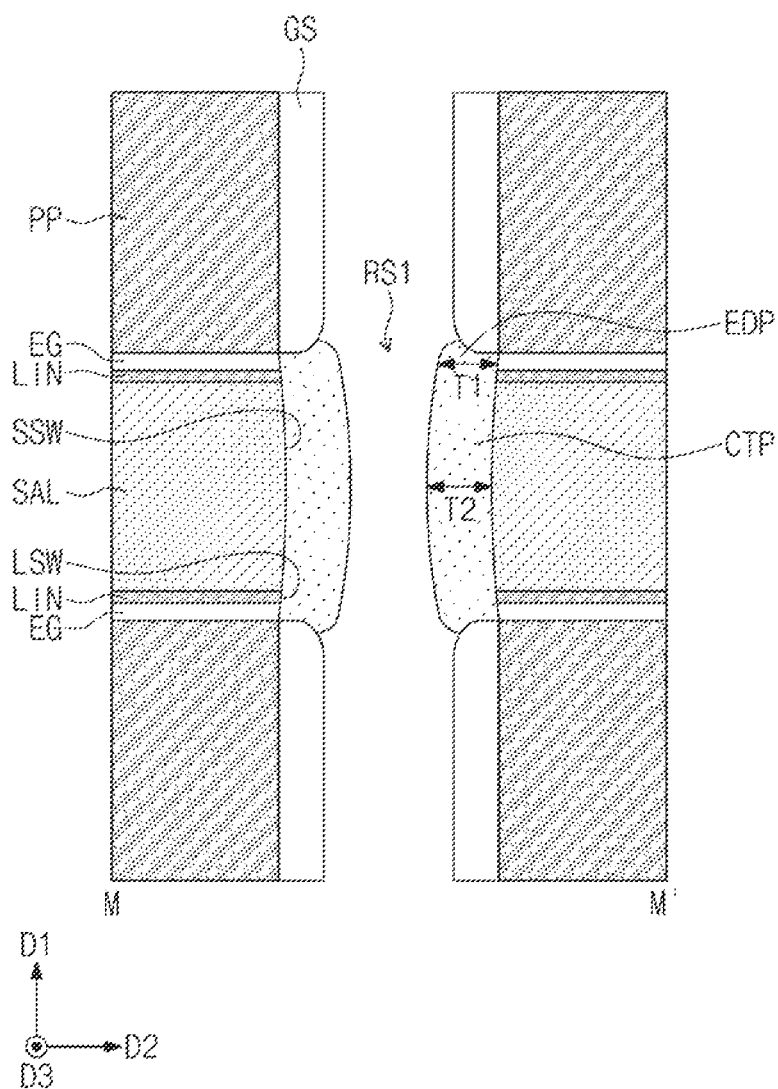
Figure 12B:
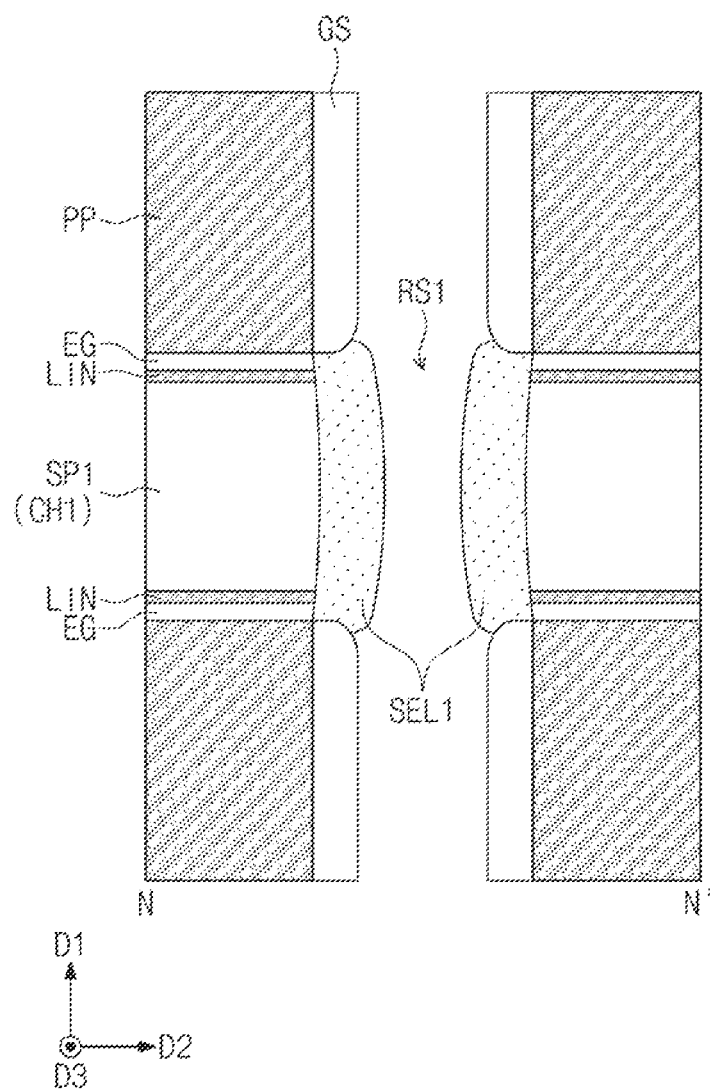
Figure 13A:
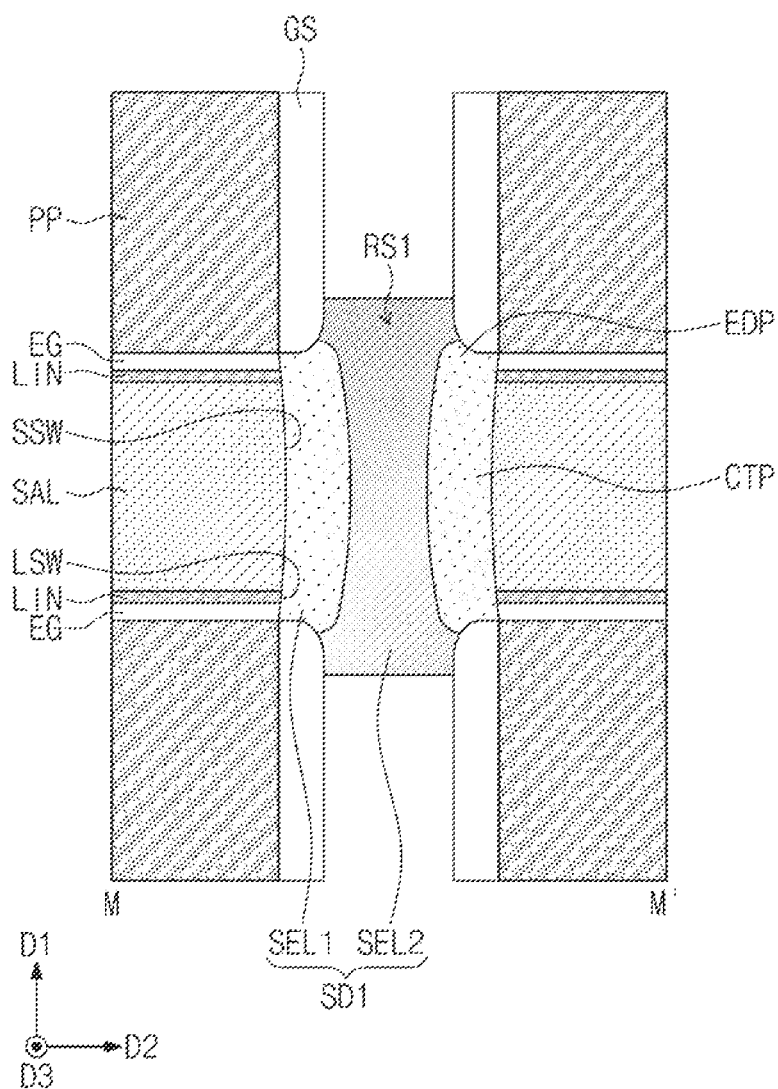
Figure 13B:
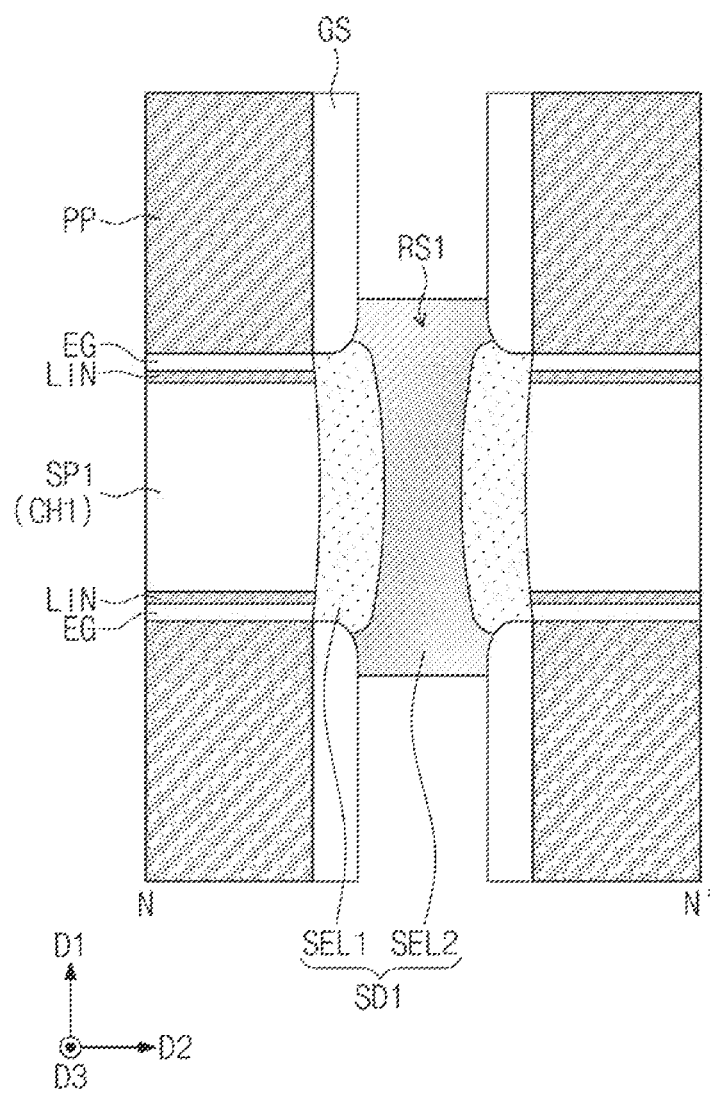
Figure 14A:
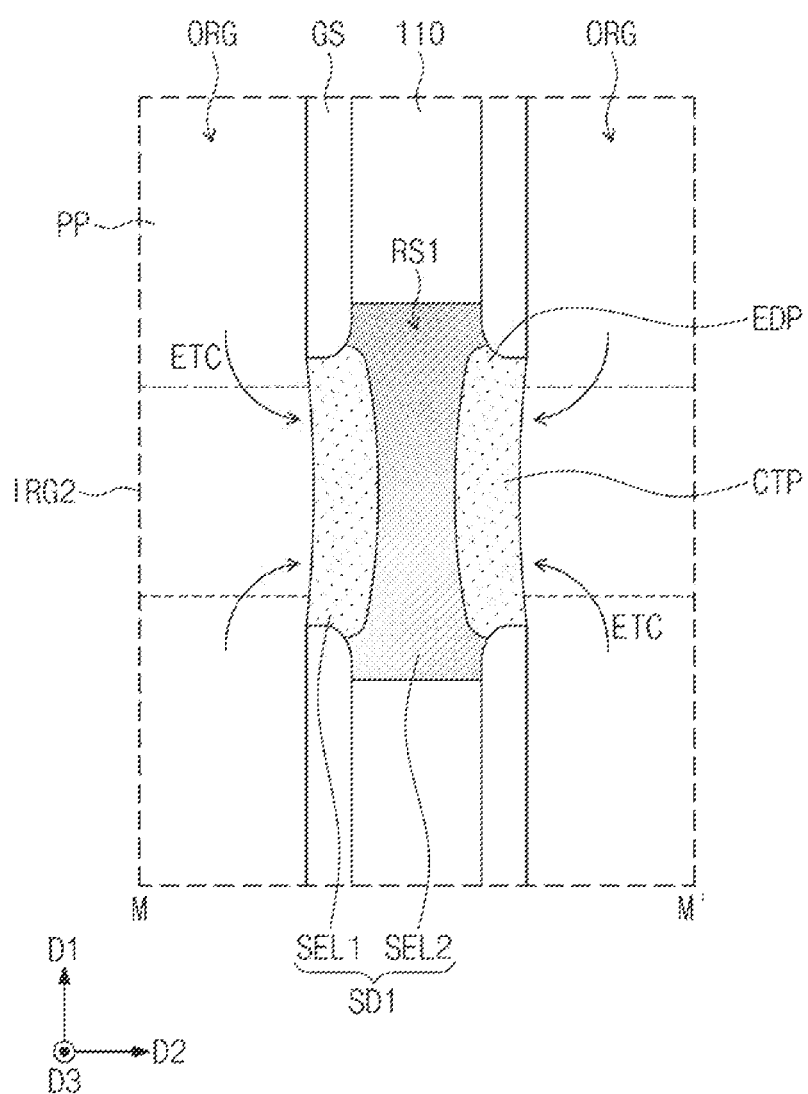
Figure 14B:
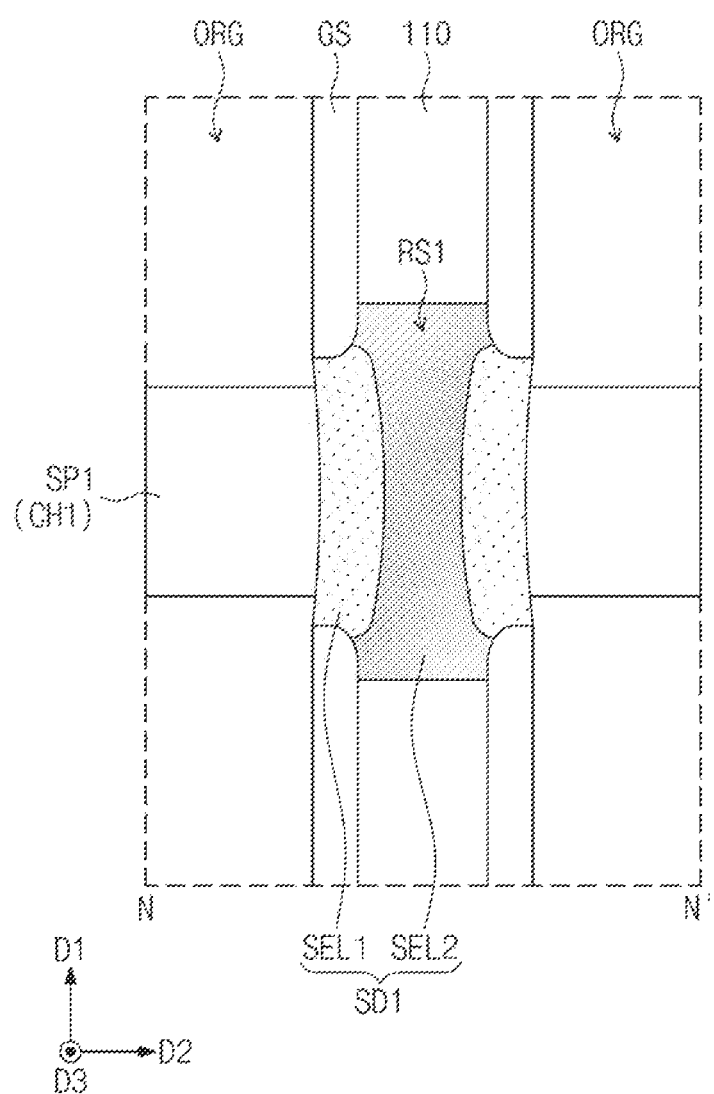

FIGS. 11A to 14B are plan views illustrating a method of forming a first source/drain pattern on a PMOSFET region, according to an embodiment of the inventive concept. In detail, FIGS. 11A and 11B are top plan views, which are respectively taken along lines M-M' and N-N' of FIG. 7A. FIGS. 12A and 13A are top plan views, which are respectively taken along a line M-M' of FIG. 8A. FIGS. 12B and 13B are top plan views, which are respectively taken along a line N-N' of FIG. 8A. FIGS. 14A and 14B are top plan views, which are respectively taken along the lines M-M' and N-N' of FIG. 7A.

Figure 7A:
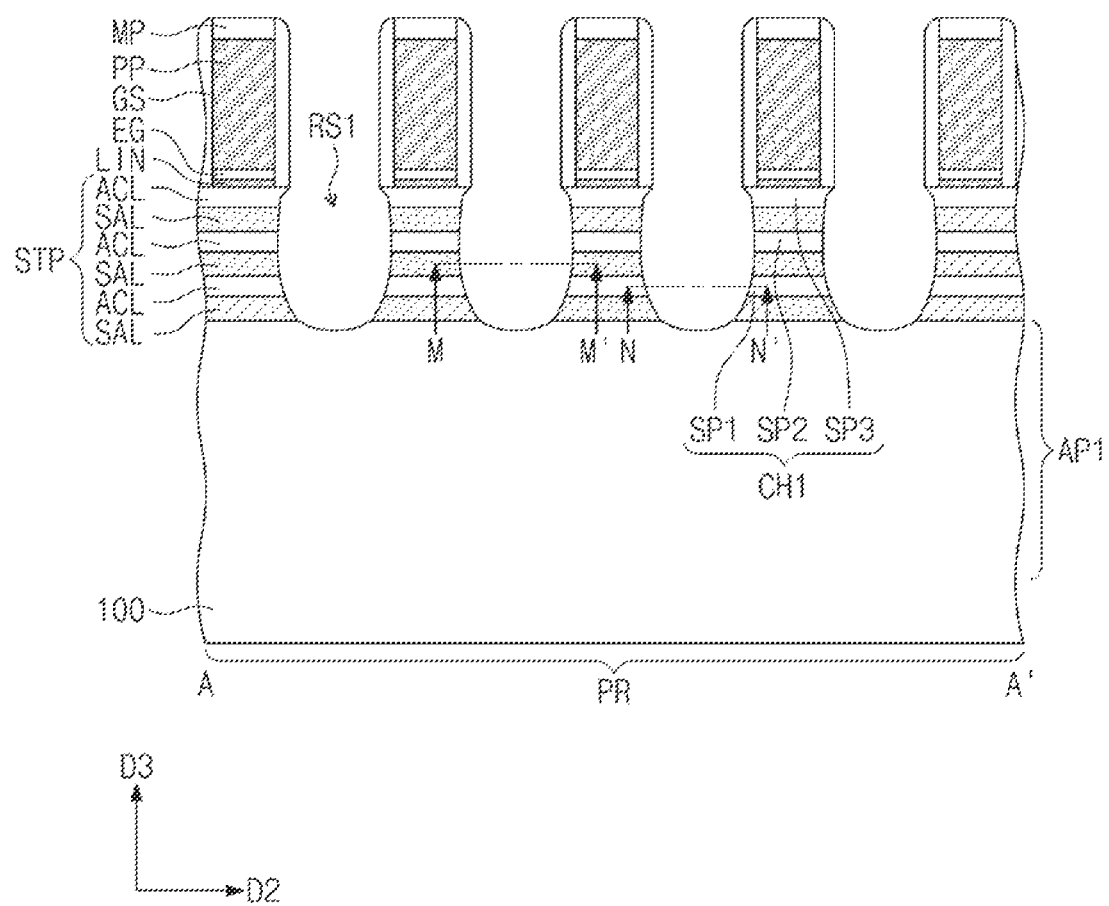
Figure 7B:
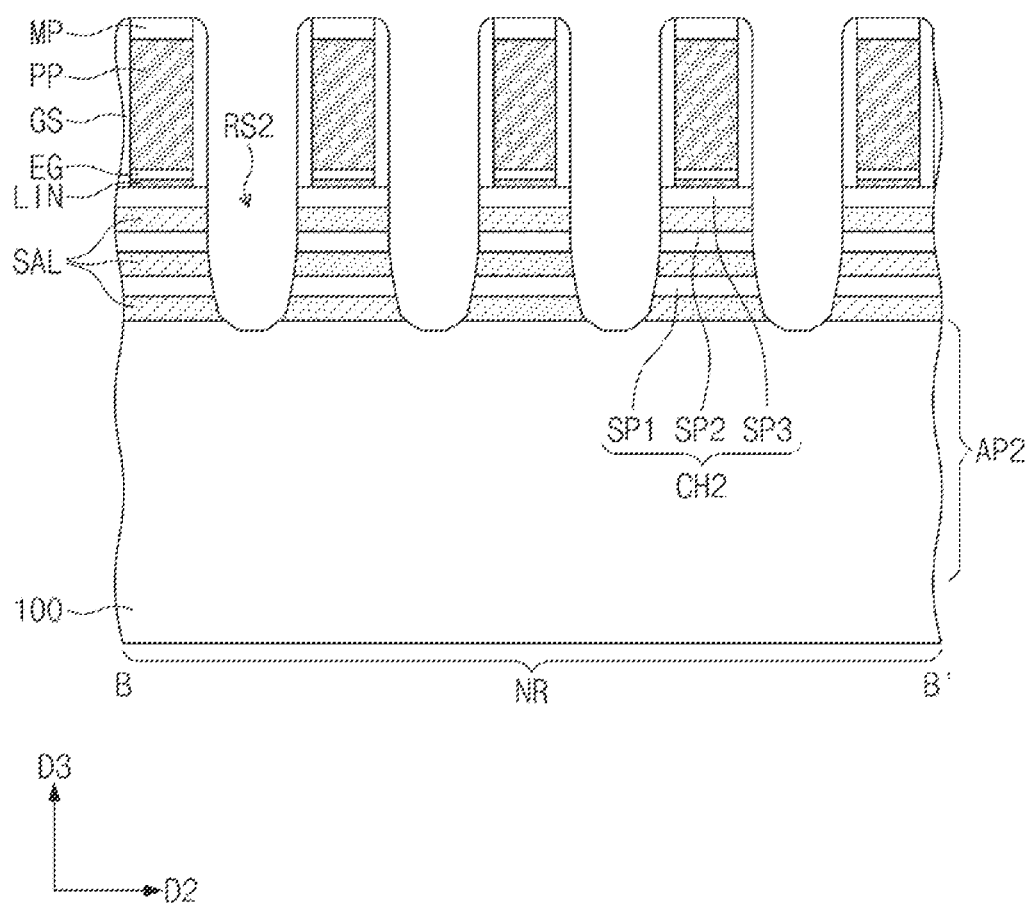
Figure 7C:
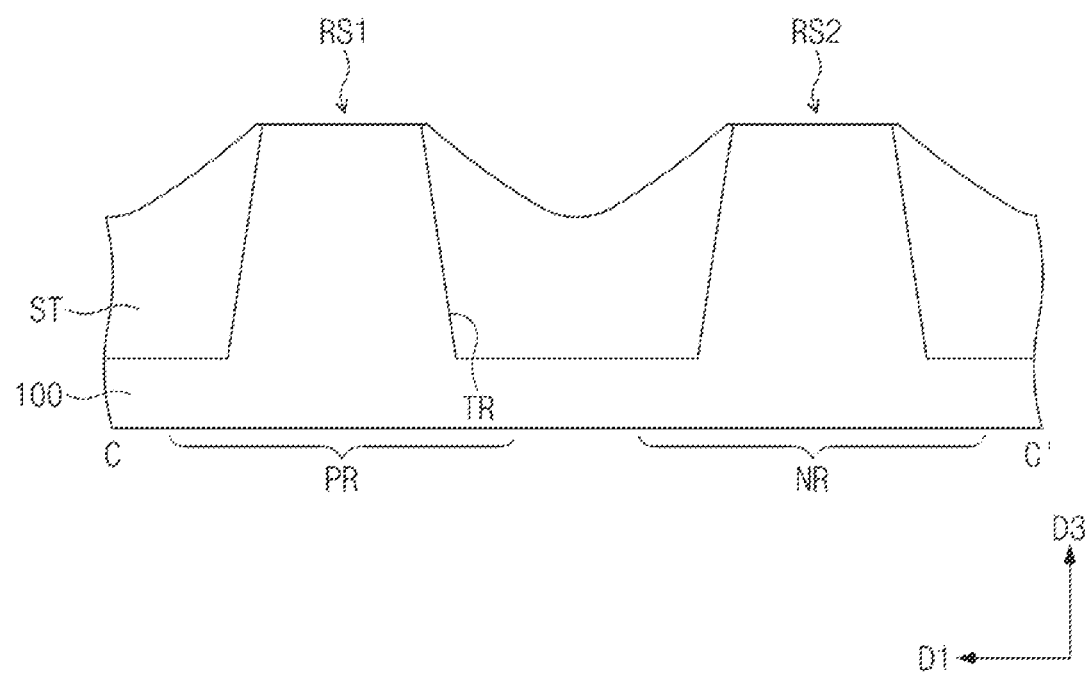
Figure 7D:
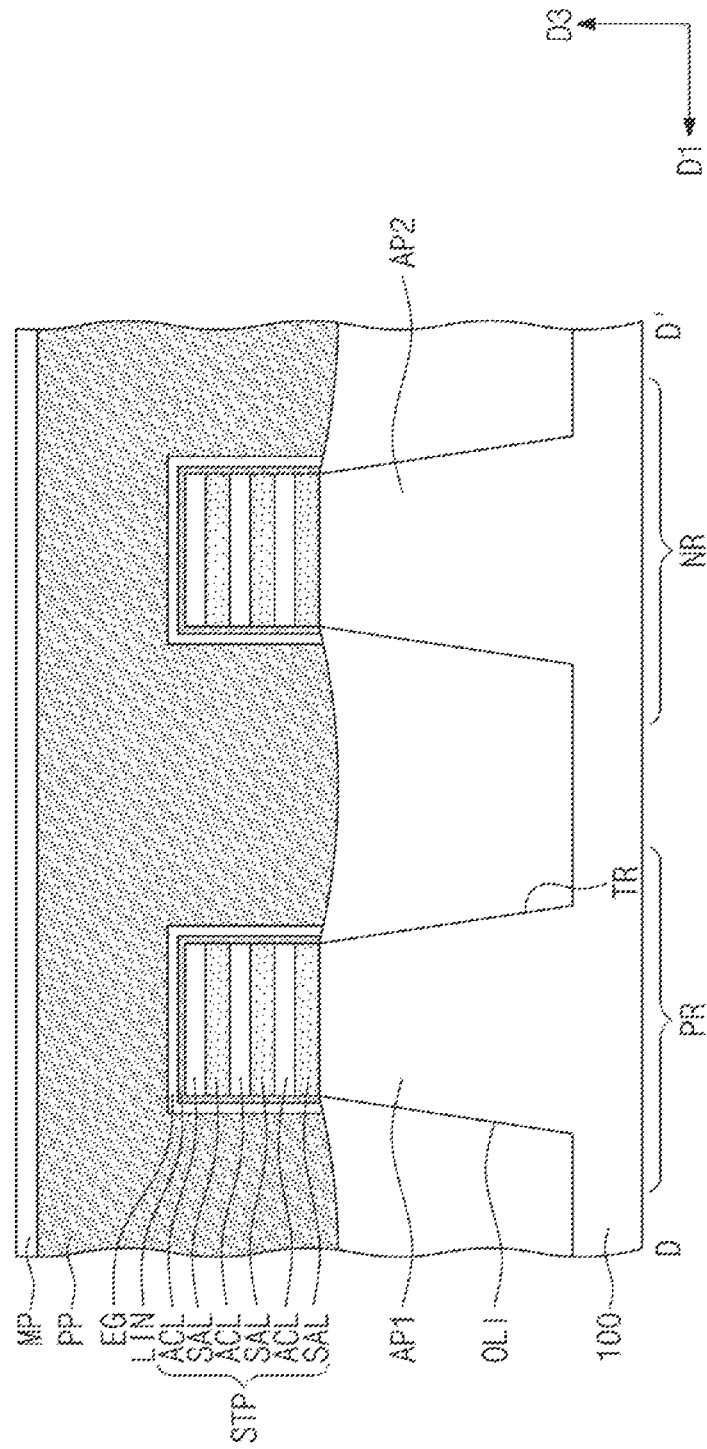
Figure 11B:
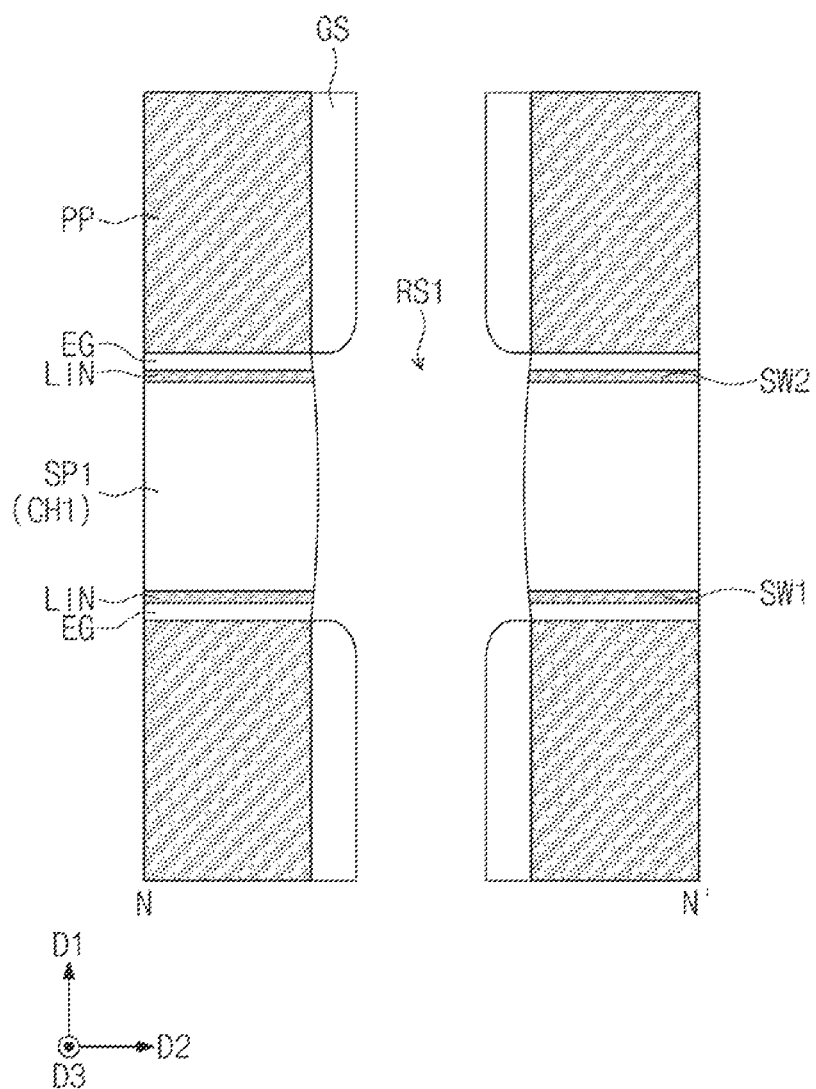

Referring to FIGS. 7A, 11A, and 11B, the first recess RS1 may be formed by etching the stacking pattern STP, which is formed on the first active pattern AP1, using the gate spacers GS as an etch mask. The first semiconductor pattern SP1 of the stacking pattern STP may have side surfaces SW1 and SW2 that are covered with the liner layer LIN. The sacrificial layer SAL of the stacking pattern STP may have side surfaces SW3 and SW4 that are covered with the liner layer LIN. The liner layer LIN and the oxide layer EG may be exposed through the first recess RS1.

In an embodiment, since the side surfaces SW1 and SW2 of the first semiconductor pattern SP1 are directly covered with the liner layer LIN, germanium (Ge) atoms in the liner layer LIN may be diffused into the first semiconductor pattern SP1. Accordingly, the germanium (Ge) atoms may serve as impurities in the first semiconductor pattern SP1. The germanium (Ge) atoms in the liner layer LIN may be diffused into the first semiconductor pattern SP1 through the side surfaces SW1 and SW2 of the first semiconductor pattern SP1. Thus, as previously described with reference to FIG. 3B, the germanium concentration in the first semiconductor pattern SP1 may increase from the first side surface SW1 toward the center region of the first semiconductor pattern SP1, may have the minimum value at the center region, and may increase from the center region toward the second side surface SW2.

As previously described with reference to FIGS. 7A to 7D, the formation of the first recess RS1 may include etching the active layer ACL and the sacrificial layer SAL. According to an embodiment of the inventive concept, the formation of the first recess RS1 may further include etching the liner layer LIN and the oxide layer EG.

During the etching process for forming the first recess RS1, an etch rate of the liner layer LIN, which contains high concentration of germanium (Ge), may be higher than an etch rate of the sacrificial layer SAL, which contains low concentration of germanium (Ge). Thus, a side surface SSW of the sacrificial layer SAL exposed through the first recess RS1 may further protrude toward a center of the first recess RS1, compared to a side surface LSW of the liner layer LIN exposed through the first recess RS1.

Figure 8A:
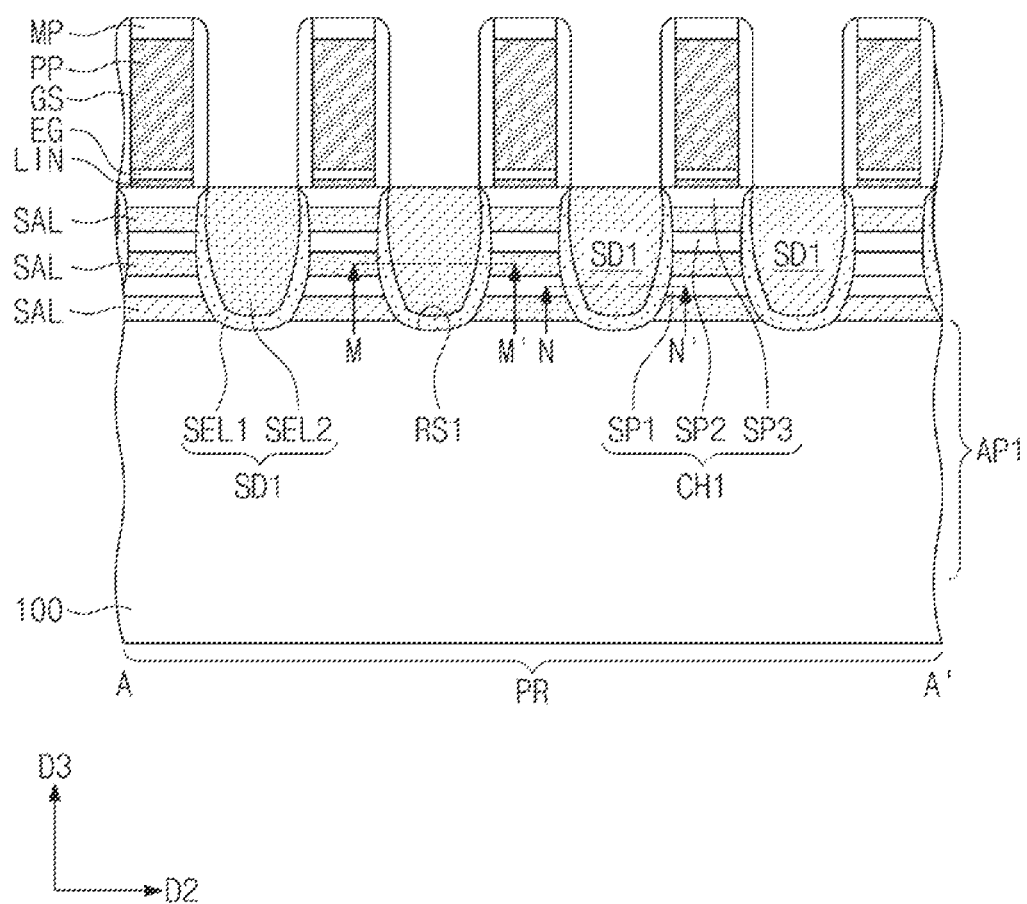
Figure 8B:
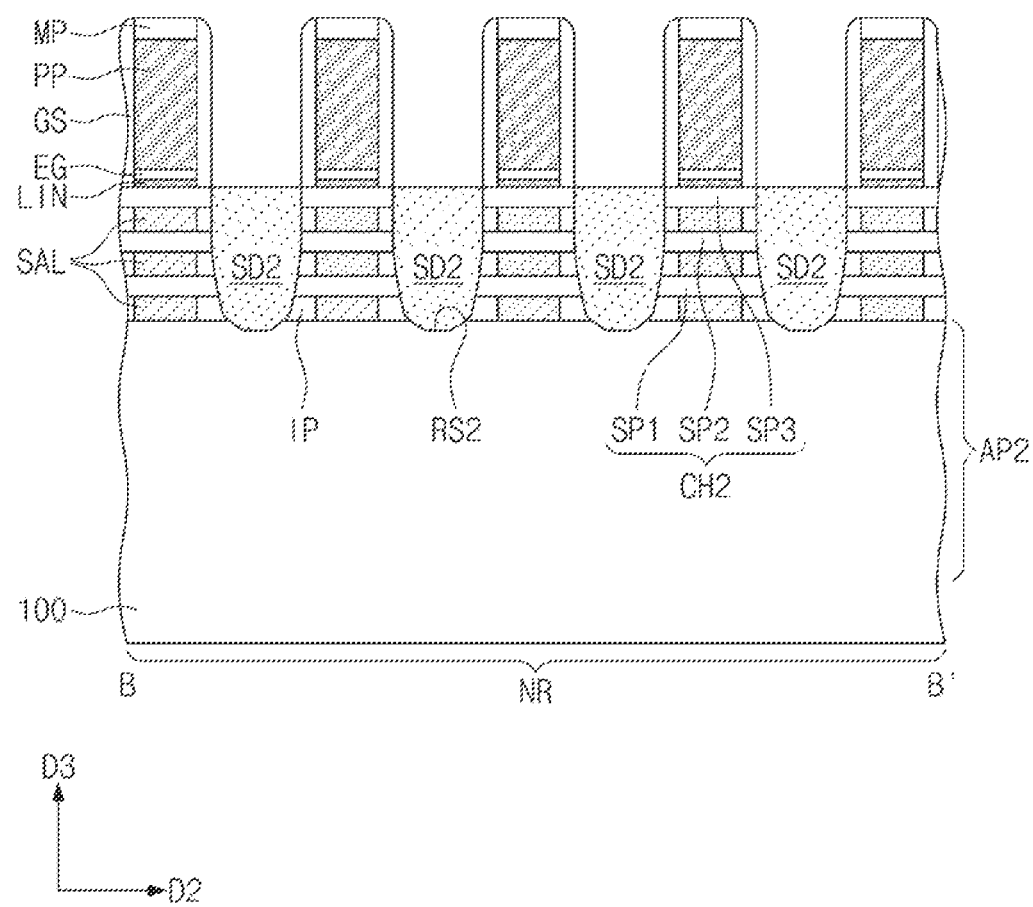
Figure 8C:
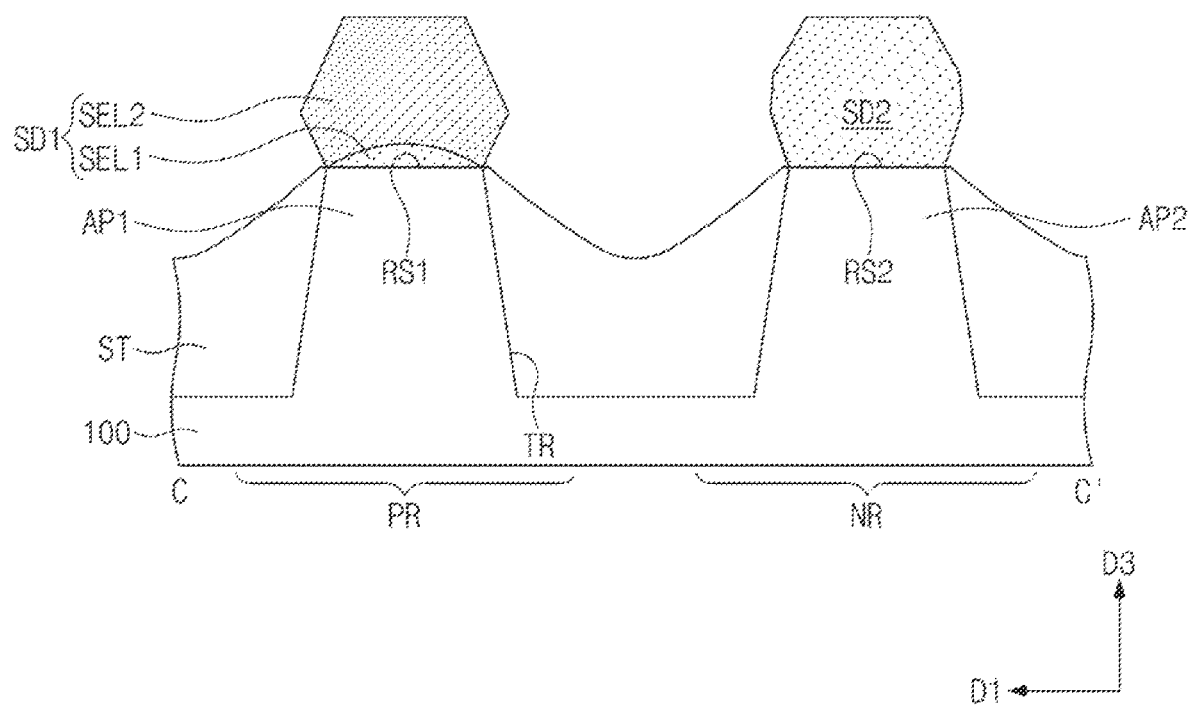
Figure 8D:
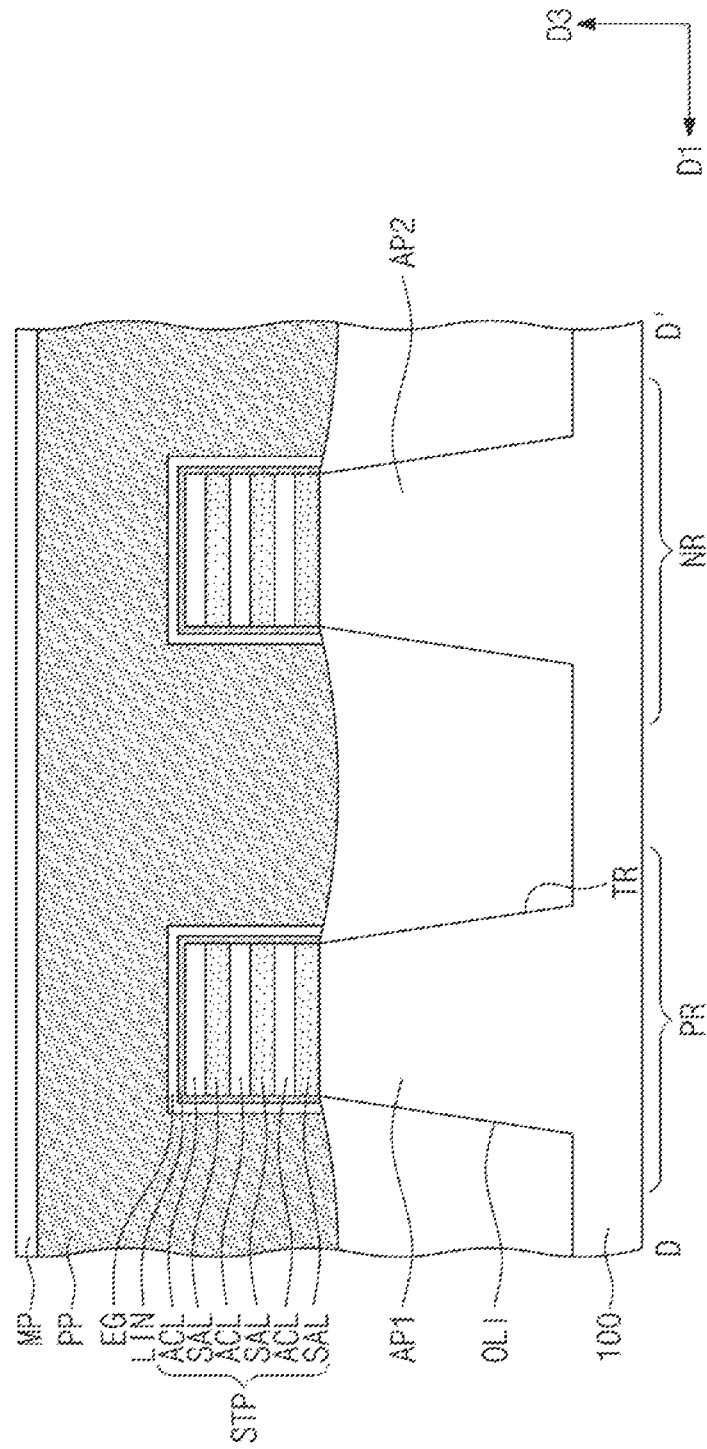

Referring to FIGS. 8A, 12A, and 12B, the first semiconductor layer SEL1 may be formed by performing a first SEG process on the active layer ACL, the sacrificial layer SAL, and the liner layer LIN, which are exposed through the first recess RS1. The first semiconductor layer SEL1 may include the edge portion EDP and the center portion CTP, which are formed on the liner layer LIN and the sacrificial layer SAL, respectively.

The edge portion EDP may be formed to have the first thickness T1 in the second direction D2. The center portion CTP may be formed to have the second thickness T2 in the second direction D2. The second thickness T2 may be equal to or larger than the first thickness T1. The ratio T1/T2 of the first thickness T1 to the second thickness T2 may range from 0.5 to 1.

In an embodiment, a growth speed of the first semiconductor layer SEL1 on the liner layer LIN may be substantially equal to or greater than that on the sacrificial layer SAL. Furthermore, since, as described above, the side surface LSW of the liner layer LIN is recessed compared with the side surface SSW of the sacrificial layer SAL, the edge portion EDP on the liner layer LIN may be grown to have a sufficient thickness that is close to that of the center portion CTP.

Referring to FIGS. 8A, 13A, and 13B, a second SEG process may be performed on the first semiconductor layer SEL1 to form the second semiconductor layer SEL2 filling the first recess RS1. The first semiconductor layer SEL1 and the second semiconductor layer SEL2 may constitute the first source/drain pattern SD1.

Figure 9A:
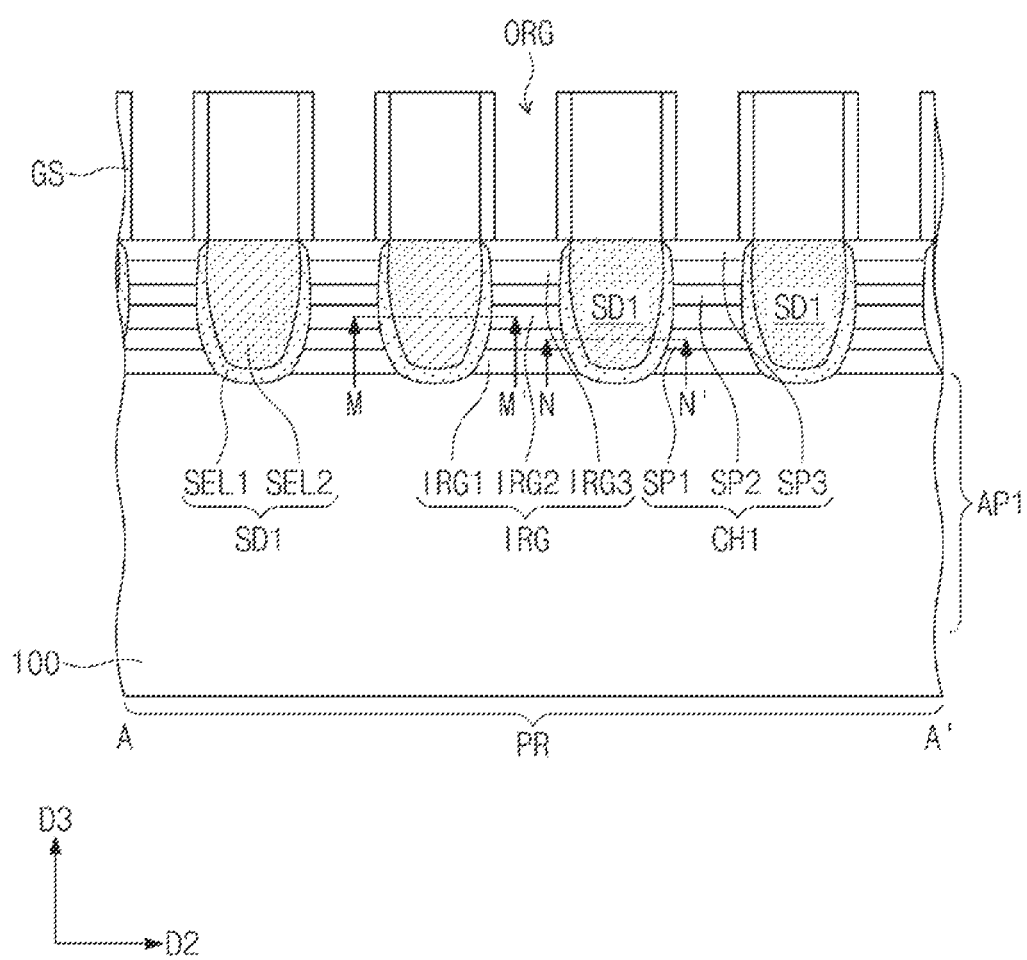
Figure 9B:
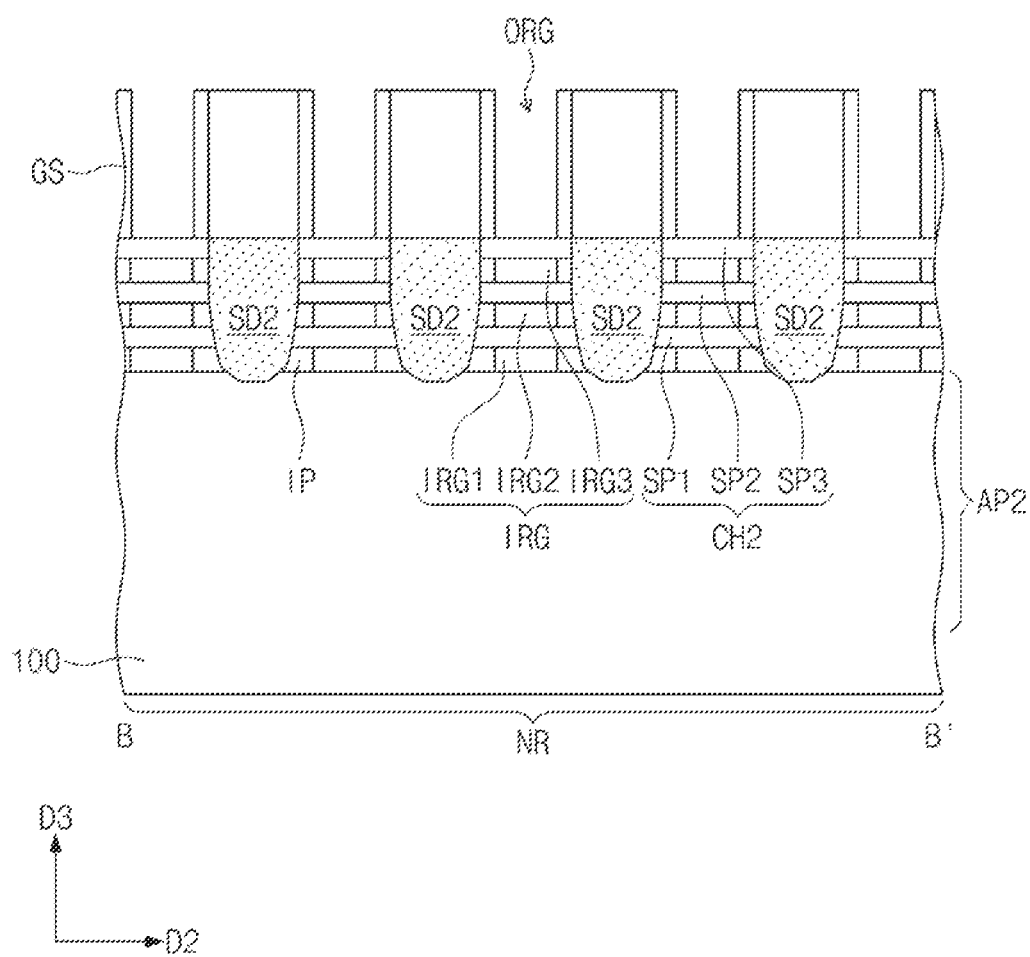
Figure 9C:
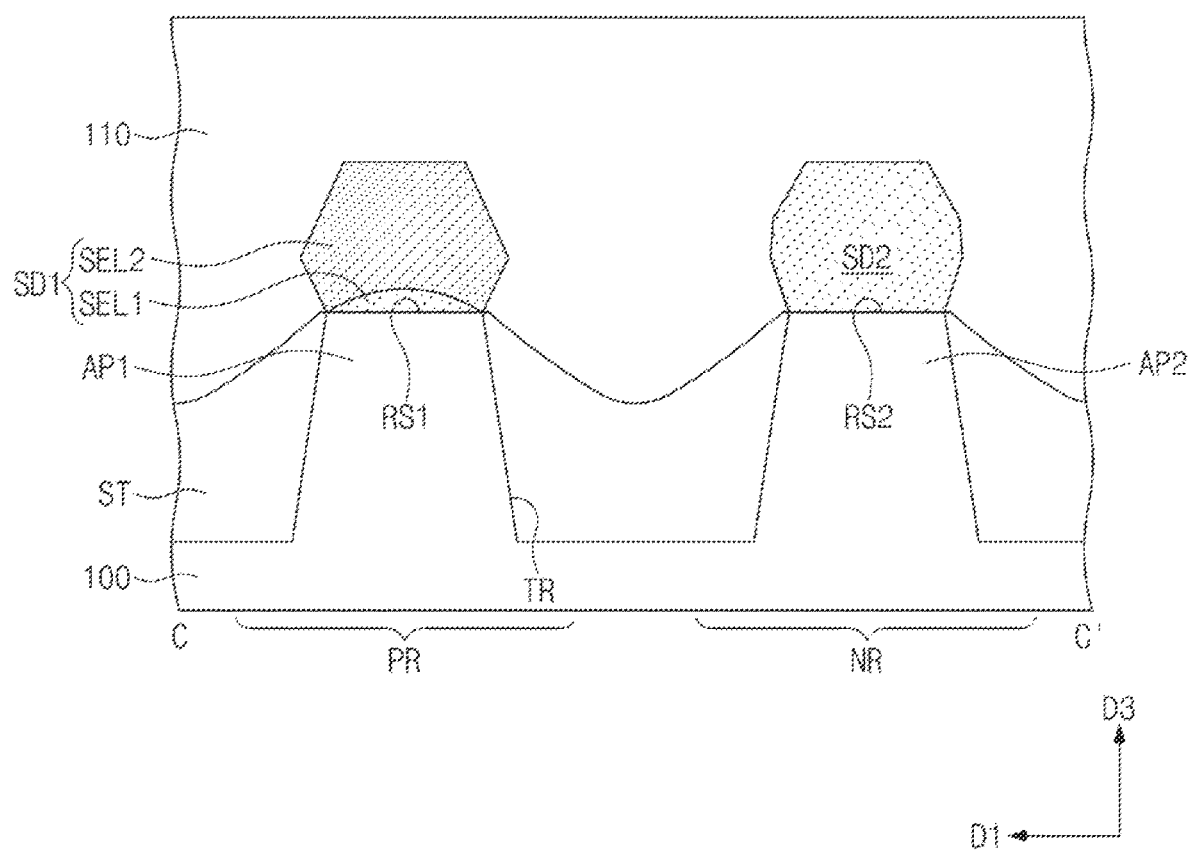
Figure 9D:
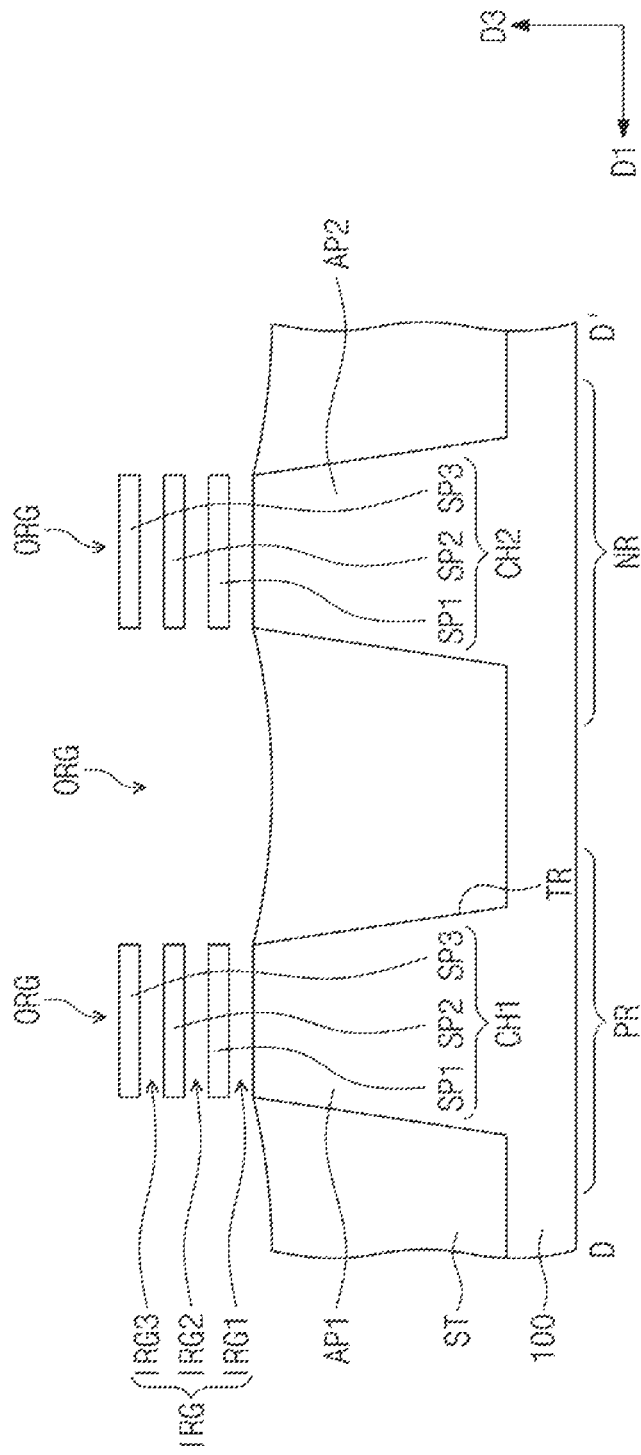
Figure 10A:
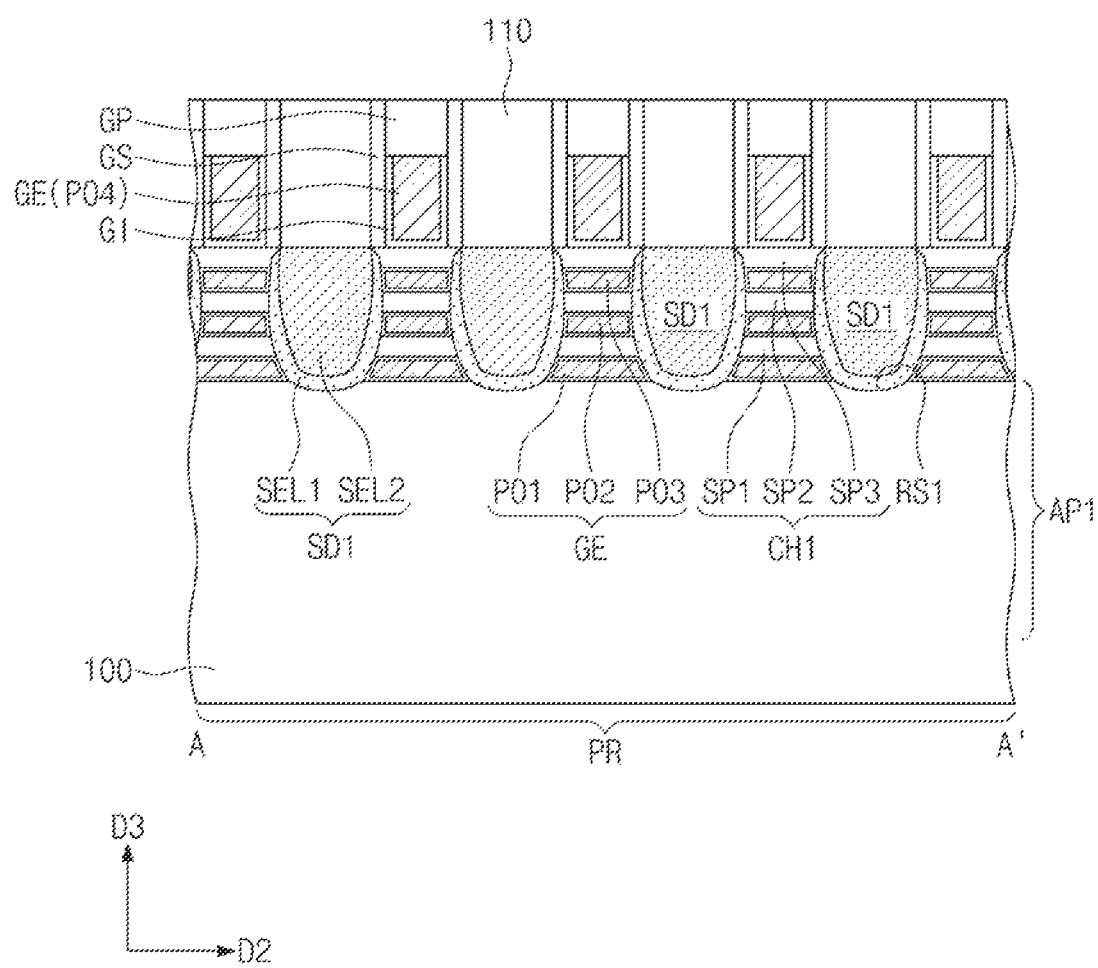
Figure 10B:
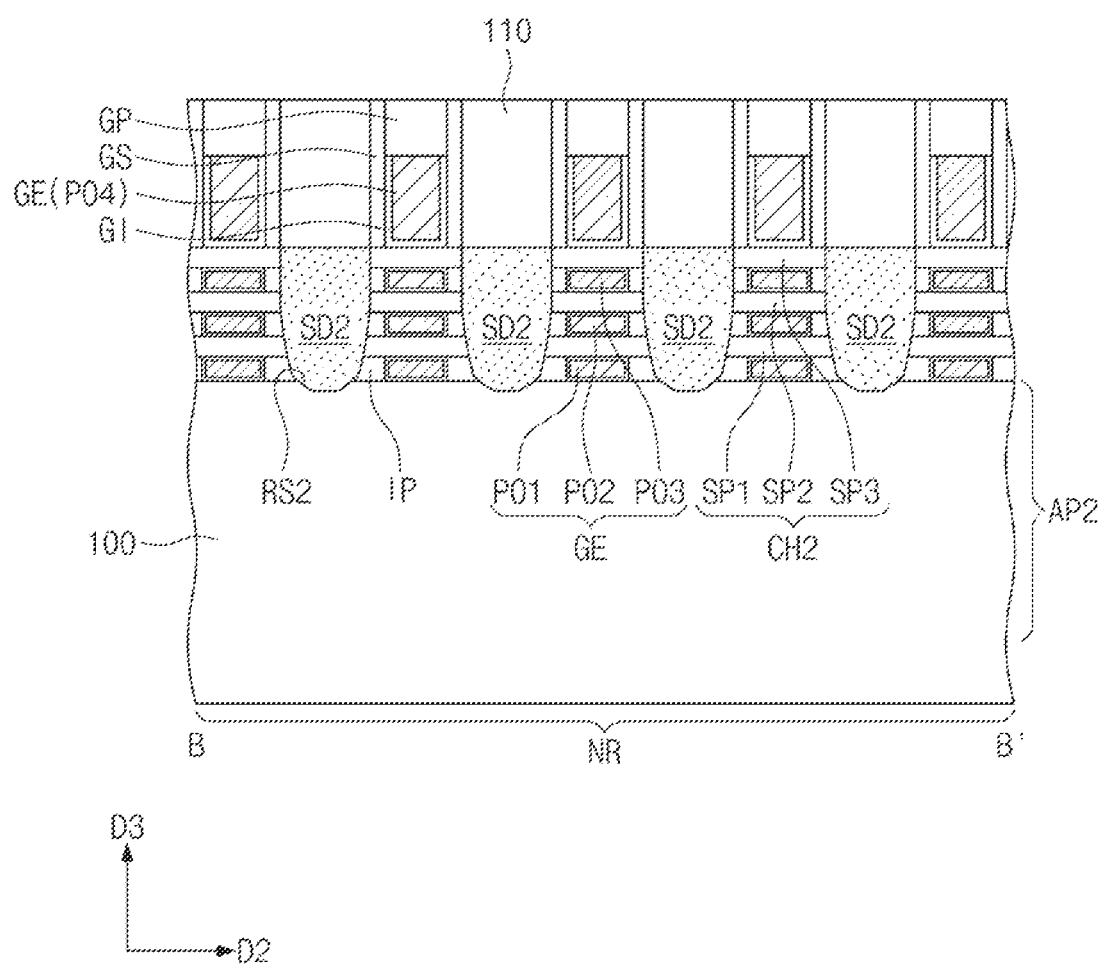
Figure 10C:
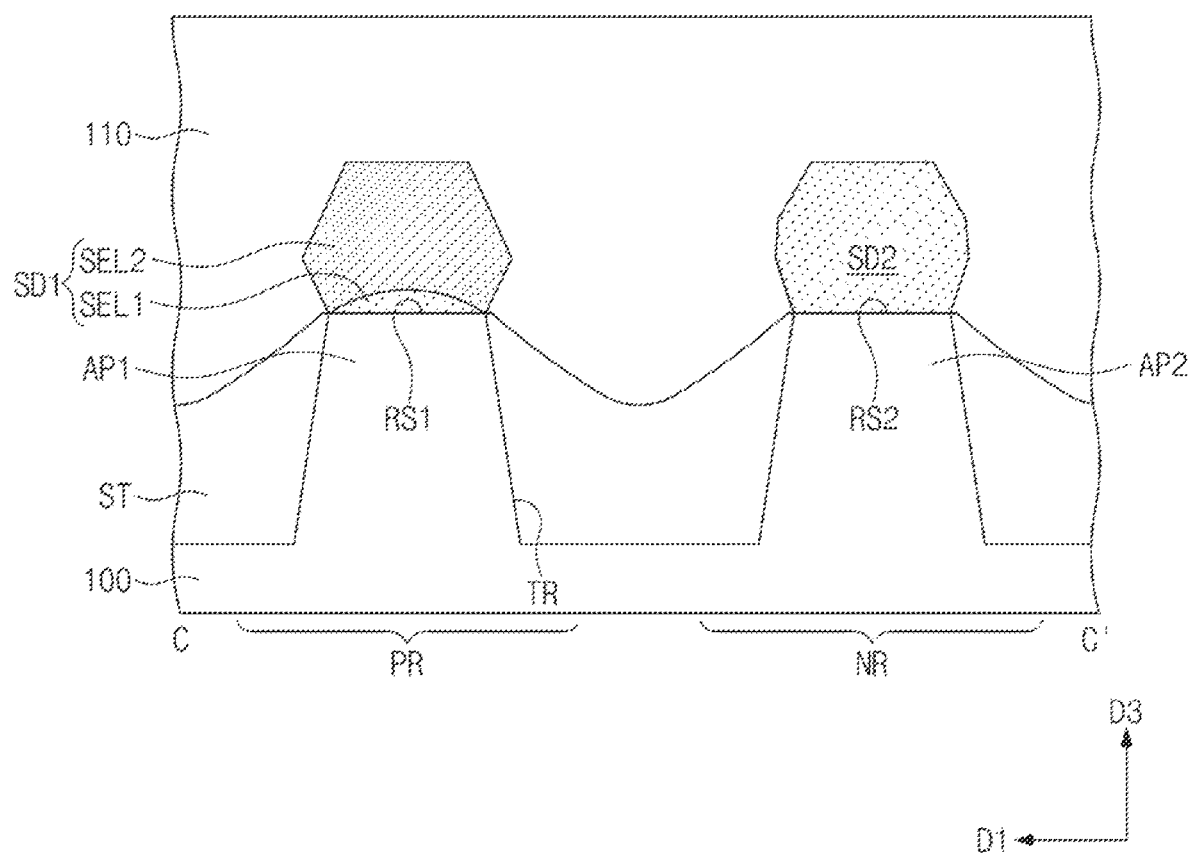
Figure 10D:
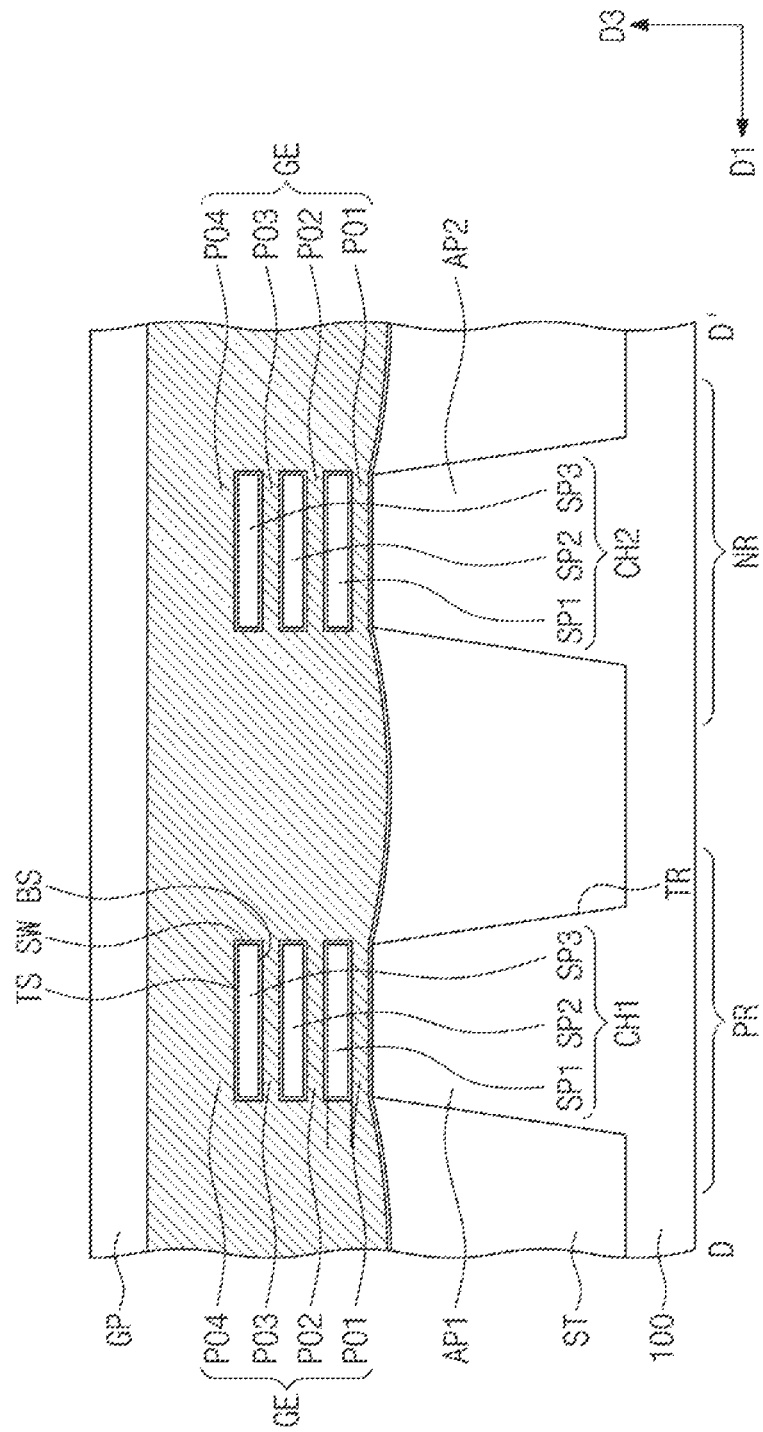

Referring to FIGS. 9A, 14A, and 14B, the outer region ORG may be formed by removing the sacrificial pattern PP, the oxide layer EG, and the liner layer LIN. Thereafter, an inner region (e.g., the second inner region IRG2) may be formed by selectively removing the sacrificial layer SAL exposed through the outer region ORG.

The etching process on the sacrificial layer SAL may be chosen to have a high etch rate for a material (e.g., SiGe) having a relatively high germanium concentration. For example, the etching process may have a high etch rate for silicon-germanium whose germanium concentration is higher than 10 at %.

An etching material ETC, which is used for the etching process on the sacrificial layer SAL, may be chosen to quickly remove the sacrificial layer SAL with a relatively high germanium concentration and to hardly remove the first semiconductor layer SEL1 with a relatively low germanium concentration.

Meanwhile, the second semiconductor layer SEL2 may have a relatively high germanium concentration, and thus, if the etching material ETC infiltrates into the second semiconductor layer SEL2, the second semiconductor layer SEL2 may be easily removed. The etching material ETC may infiltrate into the second semiconductor layer SEL2 through the edge portion EDP of the first semiconductor layer SEL1, which has a relatively small thickness, as previously described with reference to FIG. 4. Such a removal of the second semiconductor layer SEL2 caused by the etching material ETC may result in severe process failures.

However, according to an embodiment of the inventive concept, since, as described above, the first thickness T1 of the edge portion EDP of the first semiconductor layer SEL1 is as large as the second thickness T2 of the center portion CTP, it may be possible to effectively prevent the etching material ETC from infiltrating through the edge portion EDP. This may make it possible to prevent the aforedescribed process failures and thereby to improve the reliability of the semiconductor device.

Referring back to FIGS. 3A and 3B, the gate electrode GE may be formed in the outer region ORG and the second inner region IRG2. In an embodiment, since the gate electrode GE is formed in a region from which the oxide layer EG and the liner layer LIN are removed, a volume of the gate electrode GE may be further increased. Accordingly, it may be possible to improve channel controllability of the gate electrode GE and thereby to improve electrical characteristics of the semiconductor device.

Figure 15:
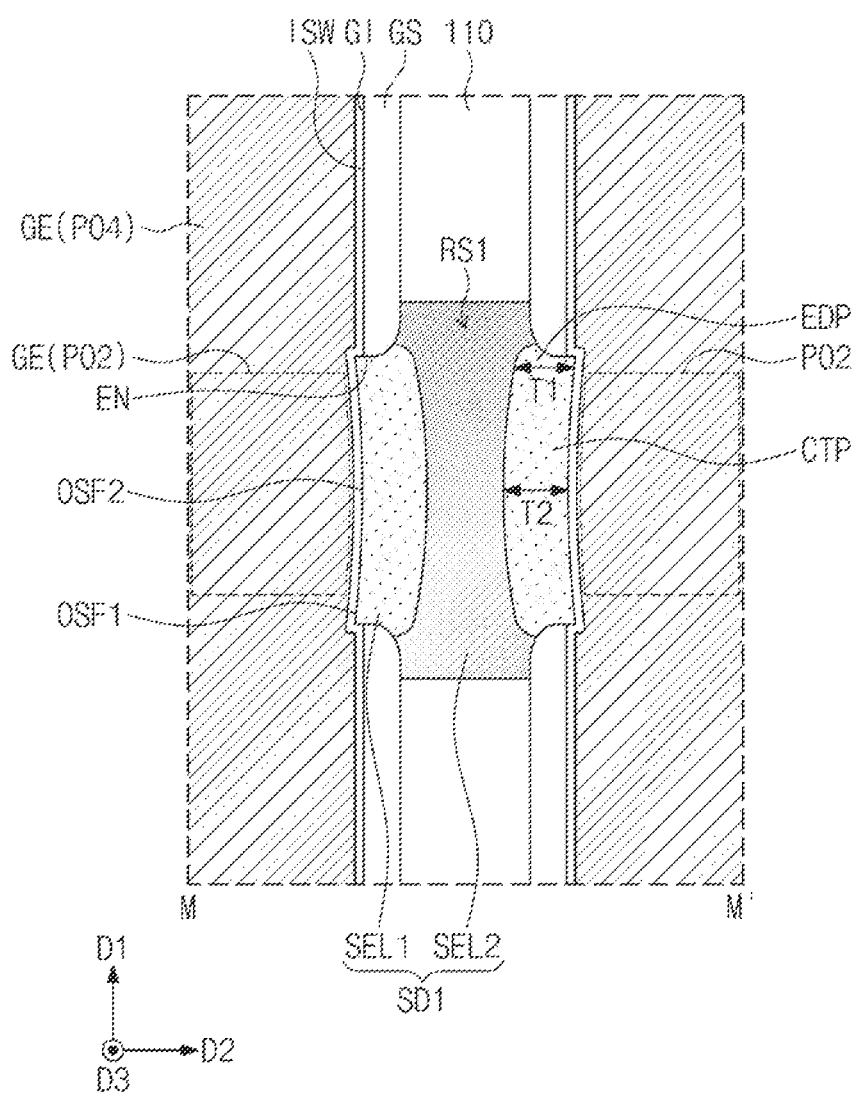
FIGS. 15 and 16 are top plan views, each of which is taken along the line M-M' of FIG. 2A to illustrate a semiconductor device, according to an example embodiment of the inventive concept.
Figure 16:
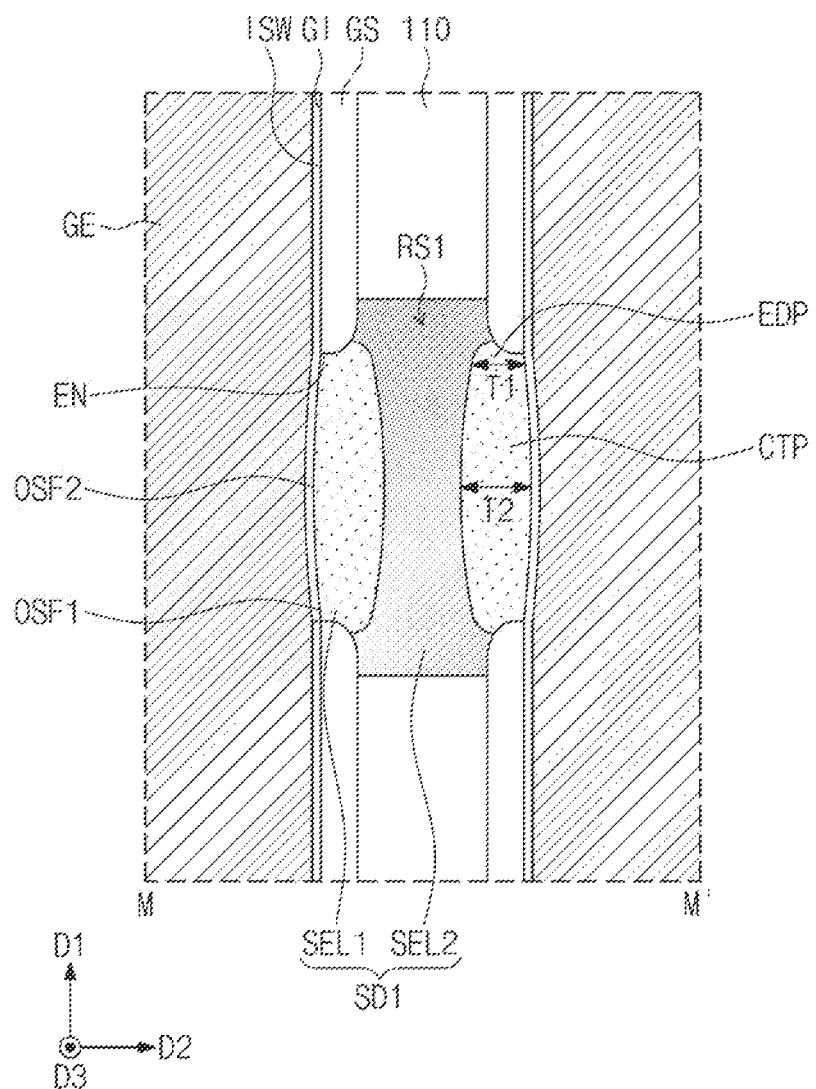

FIGS. 15 and 16 are top plan views, each of which is taken along the line M-M' of FIG. 2A to illustrate a semiconductor device according to an embodiment of the inventive concept. In the following description, an element previously described with reference to FIGS. 1, 2A to 2D, 3A, and 3B may be identified by the same reference number without repeating an overlapping description thereof.

Referring to FIG. 15, the outer side surfaces OSF1 and OSF2 of the first semiconductor layer SEL1 may further protrude toward a center of the gate electrode GE, compared with an inner side surface ISW of the gate spacer GS. More specifically, the outer side surface OSF1 of the edge portion EDP of the first semiconductor layer SEL1 may be recessed toward the center of the gate electrode GE, compared with the inner side surface ISW of the gate spacer GS. A width of the second portion PO2 of the gate electrode GE adjacent to the edge portion EDP may be smaller than a width of the fourth portion PO4 of the gate electrode GE between the gate spacers GS, when measured in the second direction D2.

Referring to FIG. 16, the first outer side surface OSF1 of the first semiconductor layer SEL1 may be further recessed toward the second semiconductor layer SEL2, compared with the second outer side surface OSF2, as previously described with reference to FIG. 4. However, the first thickness T1 of the edge portion EDP of the first semiconductor layer SEL1 may be sufficiently thick to be similar to the second thickness T2 of the center portion CTP. For example, the ratio T1/T2 of the first thickness T1 to the second thickness T2 may range from 0.5 to 1. The second outer side surface OSF2 of the center portion CTP may further protrude toward a center of the gate electrode GE, compared with the inner side surface ISW of the gate spacer GS.

According to an embodiment of the inventive concept, a semiconductor device may include a liner layer, which contains high concentration of germanium (Ge), and in this case, it may be possible to effectively prevent a source/drain pattern from being removed in a step of etching a sacrificial layer to be replaced with a gate electrode. Thus, reliability of the semiconductor device may be improved. Furthermore, according to an embodiment of the inventive concept, it may be possible to increase a volume of the gate electrode and to improve electric characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor device, comprising:
an active pattern on a substrate;
a source/drain pattern on the active pattern;
a channel pattern provided on the active pattern and connected to the source/drain pattern, the channel pattern comprising semiconductor patterns, which are stacked to be spaced apart from each other;
a gate electrode extending in a first direction and crossing the channel pattern; and
a gate insulating layer interposed between the gate electrode and the channel pattern,
wherein the source/drain pattern comprises a first semiconductor layer and a second semiconductor layer on the first semiconductor layer, wherein the first semiconductor layer comprises a center portion and an edge portion, which is adjacent to a side of the center portion in the first direction,
wherein the edge portion comprises a first outer side surface in contact with the gate insulating layer,
wherein the center portion comprises a second outer side surface in contact with the gate insulating layer, and
wherein the second outer side surface is further recessed toward the second semiconductor layer, compared with the first outer side surface.

2. The semiconductor device of claim 1,
wherein the center portion is in contact with a first semiconductor pattern, which is one of the semiconductor patterns,
wherein the edge portion has a first thickness in a second direction crossing the first direction,
wherein the center portion has a second thickness in the second direction, and
wherein a ratio of the first thickness to the second thickness ranges from 0.5 to 1.

3. The semiconductor device of claim 1,
wherein the first outer side surface and the second outer side surface constitute an outer side surface of the first semiconductor layer, and
wherein the outer side surface of the first semiconductor layer has a profile that is concave toward the second semiconductor layer.

4. The semiconductor device of claim 1,
wherein the gate electrode comprises a portion filling a space between adjacent ones of the semiconductor patterns, and
wherein the center portion is adjacent to the portion and the gate insulating layer is interposed between the center portion and the portion.

5. The semiconductor device of claim 1,
wherein a first semiconductor pattern, which is one of the semiconductor patterns, comprises a first side surface and a second side surface which are opposite to each other in the first direction,
wherein the first side surface and the second side surface are covered with the gate insulating layer, and
wherein a germanium concentration of the first semiconductor pattern decreases from the first side surface toward a center region of the first semiconductor pattern, has a minimum value at the center region, and increases from the center region toward the second side surface.

6. The semiconductor device of claim 1, further comprising:
a gate spacer on a side surface of the gate electrode,
wherein the edge portion of the first semiconductor layer covers an end portion of the gate spacer.

7. The semiconductor device of claim 1,
wherein a largest width of a first semiconductor pattern, which is one of the semiconductor patterns, in the first direction is a first width,
wherein a largest width of the first semiconductor layer in the first direction is a second width,
wherein a largest width of the second semiconductor layer in the first direction is a third width,
wherein the second width is larger than the first width, and
wherein the third width is larger than the second width.

8. The semiconductor device of claim 1,
wherein the source/drain pattern comprises silicon-germanium (SiGe), and wherein a germanium concentration of the second semiconductor layer is higher than a germanium concentration of the first semiconductor layer.

9. The semiconductor device of claim 8,
wherein the germanium concentration of the first semiconductor layer ranges from 0 at % to 10 at %, and
wherein the germanium concentration of the second semiconductor layer ranges from 30 at % to 70 at %.

10. The semiconductor device of claim 1,
wherein the source/drain pattern is provided in a recess, which is formed in an upper portion of the active pattern,
wherein the first semiconductor layer covers an inner surface of the recess,
wherein the second semiconductor layer fills the recess, and
wherein a volume of the second semiconductor layer is larger than a volume of the first semiconductor layer.

11. A semiconductor device, comprising:
a substrate including a peripheral region;
a peripheral active pattern on the peripheral region;
a peripheral source/drain pattern on the peripheral active pattern;
a peripheral channel pattern on the peripheral active pattern, the peripheral channel pattern comprising sacrificial layers and semiconductor patterns, which are alternately stacked, the semiconductor patterns comprising silicon (Si) and the sacrificial layers comprising silicon-germanium (SiGe);
a peripheral gate electrode on the peripheral channel pattern; and
a liner layer interposed between the peripheral gate electrode and the peripheral channel pattern,
wherein the liner layer has a thickness ranging from 1 nm to 5 nm,
wherein the liner layer comprises silicon-germanium (SiGe) or germanium (Ge),
wherein a germanium concentration of the liner layer is higher than a germanium concentration of the sacrificial layers, and
wherein a difference between the germanium concentration of the liner layer and the germanium concentration of the sacrificial layers is greater than 5 at %.

12. The semiconductor device of claim 11,
wherein the germanium concentration of the liner layer ranges from 35 at % to 100 at %, and
wherein the germanium concentration of the sacrificial layers ranges from 10 at % to 30 at %.

13. The semiconductor device of claim 11, further comprising:
a peripheral gate insulating layer interposed between the peripheral gate electrode and the liner layer,
wherein the peripheral gate insulating layer comprises an oxide layer and a high-k dielectric layer on the oxide layer.

14. The semiconductor device of claim 13, wherein a thickness of the oxide layer is larger than a thickness of the liner layer.

15. The semiconductor device of claim 11,
wherein the peripheral channel pattern protrudes above a device isolation layer, and
wherein the peripheral gate electrode is provided on a top surface and opposite side surfaces of the peripheral channel pattern.

16. A semiconductor device, comprising:
an active pattern on a substrate;
a source/drain pattern on the active pattern;
a channel pattern provided on the active pattern and connected to the source/drain pattern, the channel pattern comprising a first semiconductor pattern, a second semiconductor pattern, and a third semiconductor pattern, which are sequentially stacked to be spaced apart from each other;
a gate electrode extending in a first direction and crossing the channel pattern, the gate electrode comprising a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern;
a gate insulating layer interposed between the channel pattern and the gate electrode;
a gate spacer on a side surface of the gate electrode;
a gate capping pattern on a top surface of the gate electrode;
a first interlayer insulating layer on the gate capping pattern;
an active contact provided to penetrate the first interlayer insulating layer and coupled to the source/drain pattern;
a gate contact provided to penetrate the first interlayer insulating layer and coupled to the gate electrode;
a second interlayer insulating layer on the first interlayer insulating layer;
a first metal layer provided in the second interlayer insulating layer, the first metal layer comprising first interconnection lines, which are electrically connected to the active contact and the gate contact, respectively;
a third interlayer insulating layer on the second interlayer insulating layer; and
a second metal layer provided in the third interlayer insulating layer,
wherein the second metal layer comprises second interconnection lines, which are electrically connected to the first interconnection lines, respectively,
wherein the first semiconductor pattern comprises a first side surface and a second side surface, which are opposite to each other in the first direction,
wherein the first side surface and the second side surface are covered with the gate insulating layer, and
wherein a germanium concentration of the first semiconductor pattern decreases from the first side surface toward a center region of the first semiconductor pattern, has a minimum value at the center region, and increases from the center region toward the second side surface.

17. The semiconductor device of claim 16,
wherein the source/drain pattern comprises a first semiconductor layer and a second semiconductor layer on the first semiconductor layer,
wherein the first semiconductor layer and the second semiconductor layer comprise silicon-germanium (SiGe),
wherein a germanium concentration of the second semiconductor layer is higher than a germanium concentration of the first semiconductor layer,
wherein the first semiconductor layer comprises:
a center portion, which is adjacent to the second portion of the gate electrode with the gate insulating layer interposed therebetween; and
an edge portion covering an end portion of the gate spacer.

18. The semiconductor device of claim 17,
wherein the edge portion has a first thickness in the second direction,
wherein the center portion has a second thickness in the second direction, and
wherein a ratio of the first thickness to the second thickness ranges from 0.5 to 1.

19. The semiconductor device of claim 17,
wherein the edge portion comprises a first outer side surface in contact with the gate insulating layer,
wherein the center portion comprises a second outer side surface in contact with the gate insulating layer, and
wherein the second outer side surface is further recessed toward the second semiconductor layer, compared with the first outer side surface.

20. The semiconductor device of claim 17,
wherein a largest width of the first semiconductor pattern in the first direction is a first width,
wherein a largest width of the first semiconductor layer in the first direction is a second width,
wherein a largest width of the second semiconductor layer in the first direction is a third width,
wherein the second width is larger than the first width, and
wherein the third width is larger than the second width.

* * * * *